US008076707B1

(12) United States Patent
Hyde et al.

(10) Patent No.: US 8,076,707 B1
(45) Date of Patent: Dec. 13, 2011

(54) PSEUDO-NONVOLATILE DIRECT-TUNNELING FLOATING-GATE DEVICE

(75) Inventors: John D. Hyde, Corvallis, OR (US); Todd E. Humes, Shoreline, WA (US); Christopher J. Diorio, Shoreline, WA (US); Carver A. Mead, Woodside, CA (US)

(73) Assignee: Synopsys, Inc., Mountain View, CA (US)

( * ) Notice: Subject to any disclaimer, the term of this patent is extended or adjusted under 35 U.S.C. 154(b) by 169 days.

(21) Appl. No.: 11/224,743

(22) Filed: Sep. 12, 2005

Related U.S. Application Data

(63) Continuation-in-part of application No. 10/143,557, filed on May 9, 2002, now abandoned.

(51) Int. Cl.
*H01L 29/423* (2006.01)
(52) U.S. Cl. .................. 257/314; 257/E29.136
(58) Field of Classification Search .......... 257/E29.345, 257/321
See application file for complete search history.

(56) References Cited

U.S. PATENT DOCUMENTS

| | | | | |
|---|---|---|---|---|
| 5,511,020 A * | 4/1996 | Hu et al. | ................. | 365/185.28 |
| 5,596,524 A * | 1/1997 | Lin et al. | ................. | 365/185.1 |
| 5,627,392 A | 5/1997 | Diorio et al. | ................. | 257/315 |
| 5,990,512 A | 11/1999 | Diorio et al. | ................. | 257/314 |
| 6,091,657 A * | 7/2000 | Chen et al. | ................. | 365/226 |
| 6,137,153 A * | 10/2000 | Le et al. | ................. | 257/532 |
| 6,274,898 B1 * | 8/2001 | Mehta et al. | ................. | 257/298 |
| 6,678,190 B2 | 1/2004 | Yang et al. | | |
| 6,965,142 B2 * | 11/2005 | Diorio et al. | ................. | 257/315 |
| 6,985,387 B2 * | 1/2006 | Chen et al. | ................. | 365/189.15 |
| 2004/0206999 A1 * | 10/2004 | Hyde et al. | ................. | 257/312 |

OTHER PUBLICATIONS

Tatsuya Usuki, et al., "Direct Tunneling Memory: Trade-off Between Nonvolatility and High Endurance with Low Voltage Operations", Nonvolatile Semiconductor Workshop Symposium, Aug. 12, 2001, pp. 80-81.

* cited by examiner

*Primary Examiner* — Benjamin Sandvik
(74) *Attorney, Agent, or Firm* — Fenwick & West LLP

(57) ABSTRACT

A semiconductor device is provided that uses a floating gate to store analog- and digital-valued information for periods of time measured in milliseconds to hours. Charge is added to and/or removed from the floating gate by means of direct electron tunneling through the surrounding insulator, with the insulator typically being thin enough such that appreciable tunneling occurs with an insulator voltage smaller than the difference in electron affinities between the semiconductor and the insulator and/or between the floating gate and the insulator. The stored information is refreshed or updated as needed. In many applications, the stored information can be refreshed without interrupting normal circuit operation. Adding and removing charge to or from the floating gate may be performed using separate circuit inputs, to tailor the performance and response of the floating-gate device. There is no need to use a control gate in the floating-gate structures disclosed herein.

13 Claims, 26 Drawing Sheets

PSEUDO-NONVOLATILE DIRECT-TUNNELING FLOATING-GATE DEVICE

STATEMENT OF RELATED APPLICATIONS

This patent application is a continuation-in-part of U.S. patent application Ser. No. 10/143,557 filed May 9, 2002 now abandoned in the names of inventors John D. Hyde and Yanjun Ma entitled "Metal dielectric semiconductor floating gate variable capacitor," commonly assigned herewith.

FIELD OF THE INVENTION

This invention relates to a method and apparatus for adjusting the charge stored on the floating gate of a floating-gate semiconductor device. More particularly, this invention relates to using a direct-tunneling mechanism to adjust the charge stored on analog- and digital-valued pseudo-nonvolatile floating-gate (PNVFG) MOSFETs.

BACKGROUND OF THE INVENTION

Many types of semiconductor devices exist for storing information. Generally the storage falls into one of two categories: long-term or short-term. Long-term storage devices include read only memory (ROM), programmable read only memory (PROM), electrically programmable read only memory (EPROM), electrically erasable programmable read only memory (EEPROM), flash nonvolatile memory (Flash NVM), ferroelectric random access memory (FRAM), magnetoresistive random access memory (MRAM), silicon-oxide-nitride-oxide on silicon (SONOS) memory, and many others. In many of these long-term storage devices the stored information comprises a quantity of electronic charge stored in a charge retention region of a semiconductor device. Long-term memories typically have relatively low leakage rates, so that they remain readable for a period on the order of years. Short-term storage devices generally are denser and more easily erased and rewritten than long-term storage devices, but typically suffer from relatively high leakage rates. These devices include well-known dynamic random-access memory (DRAM), switched-capacitor and capacitive trim circuits, and variants thereof. Because these devices lose their stored electronic charge typically on a timescale of microseconds to milliseconds, they need to be refreshed at least that often so that, over time, they maintain the stored information. Many circuits for refresh are well known to those of ordinary skill in the art of semiconductor design.

Many prior approaches exist for nonvolatile storage of electronic charge on floating-gate MOSFETs (metal-oxide semiconductor field effect transistors). Such approaches typically require the use of voltages higher than those needed for the operation of normal CMOS (complementary metal oxide semiconductor) logic, and/or they employ asymmetric charge control in that one technique is used to add charge to the floating gate, while a different technique (with corresponding different structure and/or different power requirements) is used to remove charge from the floating gate. In most approaches, the value of the stored charge on the floating gate cannot be read while the charge is undergoing modification.

Turning to FIG. 1, a typical prior art approach to such a device is illustrated in simplified form. A floating gate MOSFET 10 is formed on a p– substrate 12 of a semiconductor wafer. An n– well 14 is formed therein and in the n– well are formed a source region 16 and a drain region 18 of p+ material. Above the channel 20 between source 16 and drain 18 is a layer of insulator 21 such as silicon oxide (or nitride or oxynitride or other well-known insulating materials), which may be grown or deposited. Over the insulator 21 is formed a charge retention layer 22, or "floating gate" which is capable of retaining charge typically by being an isolated conductor of charge such as a metal or heavily doped polycrystalline silicon (polysilicon). An additional layer of insulator 24 is usually applied and a conductive control gate 26 usually tops out the structure. The control gate 26 is usually implemented in a second layer of heavily doped polysilicon. A common approach for adding charge to and/or removing charge from a floating-gate MOSFET is to use Fowler-Nordheim (FN) tunneling. FIGS. 2A, 2B and 2C are electron band diagrams illustrating a semiconductor, an insulator and a gate. FIG. 2A illustrates a condition with no voltage applied across the insulator. As illustrated in FIG. 2A, a relatively thick, pure, and low-leakage $SiO_2$ insulator 27 forms a potential barrier 28 that isolates the gate 30 from a doped region 32 of a semiconductor substrate. In FN tunneling, illustrated in FIG. 2B, a voltage applied across the insulator 28 causes electrons to tunnel, via quantum-mechanical mechanisms, through the potential barrier 28 between the semiconductor 32 and the insulator 27 and into the conduction band of the insulator 27, and thereby to be transported to the gate 30. A voltage of opposite polarity likewise causes electrons to be transported from the gate 30, through the insulator 27, to the semiconductor 32. FN tunneling allows charge to accumulate on the floating gate 30, or to be removed therefrom.

Using Fowler-Nordheim tunneling for charge transfer has some drawbacks. First, it requires the use of voltages that typically exceed those available for normal CMOS circuit operation. Thus charge pumps or additional power supplies are required. Second, most implementations use transistors with control gates, with the control gate typically implemented from a second layer of polysilicon over the floating gate. This additional polysilicon layer increases the cost and complexity of device manufacture over the more common single-polysilicon CMOS processing. Third, because of the relatively high electric fields required to implement Fowler-Nordheim tunneling through an insulator, damage to the insulator gradually occurs, typically resulting in increased charge leakage. This damage usually manifests as a Stress-Induced Leakage Current (SILC), and is why most EEPROM or Flash nonvolatile memories have limited lifetimes (e.g. approximately $10^5$ cycles in current commercial products).

An alternative to Fowler-Nordheim tunneling is direct tunneling. In direct tunneling, illustrated in FIG. 2C, the insulator 27 is thin enough such that appreciable tunneling occurs even when the voltage across the insulator 27 is less than the difference in electron affinities between the semiconductor 32 and the insulator 27 (e.g. 3.2 Volts for a silicon-$SiO_2$ barrier). One significant benefit of using direct tunneling over Fowler-Nordheim tunneling is reduced insulator stress and reduced SILC, due to the lower insulator electric fields. Another significant benefit is that direct tunneling doesn't require voltages significantly higher than those needed for normal logic-CMOS operation. One reason that direct tunneling has not been widely used in electronics applications is that the insulator tends to leak electrons by the same direct-tunneling mechanism as is used to write or erase it, and thus cannot retain the charge on the floating gate for more than a short period of time (from milliseconds to perhaps hours or days). For memory applications, some have enhanced the effective retention time of direct-tunneling insulators by using control gates and refresh circuits to, in effect, make a low-refresh-rate DRAM. Others have modified the insulator and/or the floating gate to add a leakage-stop barrier to retard or reduce leakage. Both of these approaches are unavailable in standard single-poly logic CMOS due to the requirement for a control gate disposed over the floating gate, or to the requirement for specialized CMOS processing to add the leakage-stop barrier. A second reason that direct tunneling has not been widely used in electronics applications is that floating gates are typically associated with nonvolatile memories, and nonvolatile memories are typically optimized to store digital data, a byproduct of which, for example, is the fact that most nonvolatile memory devices don't allow simultaneous reading and writing or reading and erasing, regardless of whether they use FN or direct tunneling, or another mechanism to write or erase the floating gate. Consequently, direct-tunneling floating-gate circuits have been generally unavailable to CMOS circuit designers.

It would be desirable to provide a floating-gate memory device compatible with generic single-poly logic-CMOS process technology without requiring double-polysilicon control gates and without the need for modified CMOS processing, while using a direct tunneling approach for adding charge to and/or removing charge from the floating gate. It would also be desirable to provide a floating-gate memory device that allowed simultaneous reading and writing and/or reading and erasing, to facilitate the use of such floating-gate circuits in analog and/or digital circuit design.

BRIEF DESCRIPTION OF THE INVENTION

A semiconductor device is provided that uses a floating gate to store analog- and digital-valued information for periods of time measured in milliseconds to hours. Charge is added to and/or removed from the floating gate by means of direct electron tunneling through the surrounding insulator, with the insulator typically being thin enough such that appreciable tunneling occurs with an insulator voltage smaller than the difference in electron affinities between the semiconductor and the insulator and/or between the floating gate and the insulator. The stored information is refreshed or updated as needed. In many applications, the stored information can be refreshed without interrupting normal circuit operation. Adding and removing charge to or from the floating gate may be performed using separate circuit inputs, to tailor the performance and response of the floating-gate device. There is no need to use a control gate in the floating-gate structures disclosed herein.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
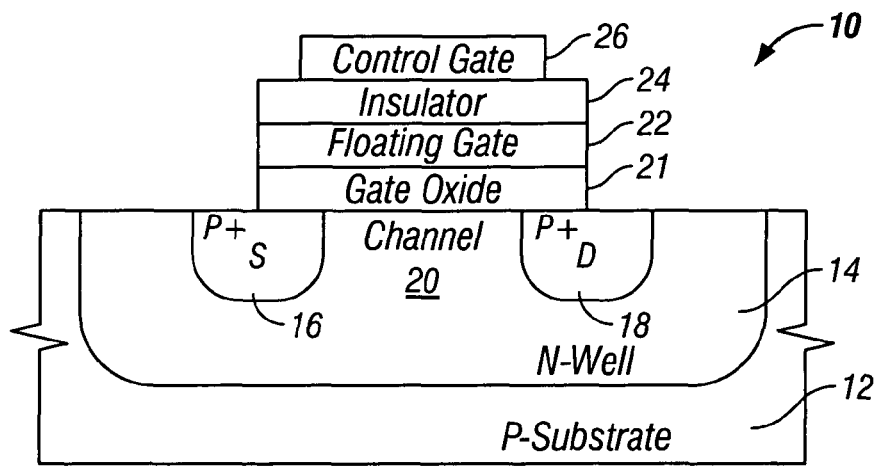
FIG. 1 is a side elevational cross-sectional drawing of a double-poly CMOS floating gate MOSFET in accordance with the prior art.

Embodiments of the present invention are described herein in the context of a pseudo-nonvolatile direct-tunneling floating-gate semiconductor device. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The present invention is directed to a pseudo-nonvolatile semiconductor device for storing analog- or digital-valued information as charge on a floating gate. In accordance with the invention, direct tunneling (as opposed to Fowler-Nordheim tunneling) is used for transferring charge to the floating gate and/or removing it from the floating gate. In order for direct tunneling to occur, the insulator must be sufficiently thin that some subsequent leakage from the floating gate is expected, therefore the information is not expected to remain intact for more than a certain amount of time (typically milliseconds to hours rather than years to decades) and needs to be updated, rewritten, or refreshed within an appropriate period of time.

Such a device, while not suited to the long-term unpowered archival storage of digital and/or analog information, is suitable and even desirable for certain applications, particularly those where it is desirable to avoid using off-chip high voltages or the need to develop high voltages on chip using charge-pump circuits (as is typically required for Fowler-Nordheim tunneling) or to avoid asymmetric write rates (as is typical in floating-gate devices that use Fowler-Nordheim tunneling to write the floating gate and hot-electron injection to erase it (or vice-versa)). Furthermore, such a device may be suitable and even desirable for applications requiring longer charge storage than is offered by conventional capacitor circuits, where leakage currents in the pn-junction used to charge or discharge the capacitor cause retention times measured in microseconds to milliseconds, but where information storage for months or years is neither required nor necessary.

For example, the present invention may be used to store calibration information for analog-to-digital converters (ADCs) and digital-to-analog converters (DACs) that undergo periodic calibration and in which the present invention would be suitable to store information during the period of time between these calibration events. The present invention may also be used for storing pseudo-nonvolatile trim information for use in linearizing transfer functions, storing delay values for continuously variable clock-delay circuits, adjusting the capacitance values of floating-gate trimmed variable capacitors, adjusting the output currents of adjustable current sources, adjusting the output voltages of adjustable voltage sources, trimming the input offsets of operational transconductance amplifiers (OTAs), trimming the center frequency of a voltage controlled oscillator (VCO), trimming the image reject response of a signal mixer, and the like.

The ability to build the present invention in standard logic CMOS using only pFET- and/or nFET-type structures, using as a gate insulator the 10 Å-50 Å $SiO_2$ gate oxides typical in modem-day CMOS processing rather than the 70 Å-200 Å oxides in traditional nonvolatile memories, without the need for high voltages, storing either analog or digital information, achieving symmetric update rates, with retention times that can be orders of magnitude longer than traditional capacitor structures that use semiconductors (i.e. pn junctions) for writing and erasing, makes the present invention a versatile device which has not heretofore existed.

Where long-term nonvolatile storage (years or decades) is not needed, or where low-voltage operation and standard-CMOS processing and design rules are desired, the structures, methods, and mechanisms described here offer major advantages. In particular, they retain analog- and/or digital-valued information longer than traditional capacitor structures that use semiconductors (i.e. the charge-storage device is connected to a pn junction) for writing and erasing, but, unlike traditional nonvolatile storage devices, use low-voltage direct tunneling to charge and/or to discharge the floating gate. Because direct tunneling does not require large insulator voltages or high electron energies to transport electrons to or from the floating gate, the rate of insulator damage is much less than in traditional NVM, allowing more frequent memory updates. In effect, the present invention enables analog- and digital-valued information storage with retention characteristics in-between those of traditional capacitor structures and traditional NVM, with longer retention than capacitors but shorter retention than NVM, while retaining all the other benefits of traditional capacitor structures such as low-voltage operation and simple methods for updating the stored information.

Low-voltage operation minimizes or even eliminates the need for additional power-supply levels or on-chip charge pumps, thus saving chip leads, chip real-estate, and power consumption.

Low-voltage operation avoids generating hot holes and/or hot electrons, which are an unavoidable byproduct of high-voltage floating-gate charging/discharging methods and can damage the insulator layer and thereby cause its wearout and ultimately lead to chip failure.

Low-voltage operation helps avoid needing large semiconductor junctions and thick gate insulators in advanced processes that would not otherwise require their use.

Because the same mechanism, low-voltage direct tunneling, can be used for both charging and discharging a floating gate, both the circuits and the operating times required to control and perform these charging and discharging operations can be symmetrical in ways typically not realizable with higher-voltage charging and discharging methods, leading to more economical implementations featuring symmetric update rates and smaller updating circuits.

Although the storage techniques described in the present invention are not long-term nonvolatile, their required frequency of refreshing is many orders of magnitude less than that necessitated by traditional capacitive storage techniques, and thus less intrusive on the operation of systems of which they form a part.

Unlike traditional floating-gate devices, the low-voltage floating-gate devices described in the present invention may have the electronic charges on their floating gates adjusted while they are operating within some larger circuit; the adjustment process does not necessarily interrupt their signal transmission or readout capabilities. Consequently, low-voltage floating-gate devices can still be used in applications where interrupting overall circuit functionality for recalibration is unacceptable.

Other suitable applications for the present invention include (but are not limited to): storing calibration information for ADCs and DACs; storing analog trim information for linearizing transfer functions; storing delay values for continuously-variable clock-delay circuits; adjusting the capacitance values of floating-gate-trimmed variable capacitors; adjusting the output-current values of adjustable current sources; adjusting the output-voltage values of adjustable voltage sources; and other applications as will now be evident to those of ordinary skill in the art.

In some applications, the disadvantage of the shorter storage time (when compared with traditional NVM) will be of minor inconvenience and the addition of refresh circuitry will be an acceptable tradeoff to obtain the advantages of the present invention. In other applications that regularly recalibrate to compensate for the effects of temperature changes, power-supply-voltage changes, or other circuit nonidealities, the present invention offers less frequent calibration intervals than traditional capacitor-based calibration structures, reducing power consumption and reducing the impact of the calibration cycles on overall circuit performance.

The present invention offers several advantages over EEPROM- or Flash-type nonvolatile memories. Wearout is reduced because lower writing voltages are used which do not generate hot carriers that damage the insulator. The present invention is available in single-poly logic CMOS processes and can be fabricated solely from the structures used to fabricate pFETs and nFETs. Both analog and digital values can be stored. The decreased writing and erasing voltage requirements mean that smaller on-chip charge pumps may be used, or they may be omitted altogether. The charging and discharging circuitry can be simplified and symmetrical.

In accordance with the present invention four premises are key. First, low voltage direct tunneling is used for charging (adding electrons to) floating gates and/or for discharging (removing electrons from) them. Second, circuit designs are used which, with very minor modifications, can work equally well with either floating gate pFETs and/or with floating gate nFETs. Third, either analog-valued or digital-valued information can be stored. Fourth, the tradeoff is accepted that stored data persists only for milliseconds to hours and must be periodically refreshed in order to be maintained indefinitely. Hence the storage function is termed "pseudo"-nonvolatile.

In this description of the invention all of the drawings are based upon a contemporary CMOS logic process with a p− type substrate. Those of ordinary skill in the art will also realize that the conductivity types could be reversed and an n− type substrate used, with n− wells changed to p− wells and the like. Those of ordinary skill in the art will also realize that insulating substrates with both n-type and p-type wells could be used, or substrates made from a material other than silicon (such as silicon on insulator (SOI) and the like. The p− (and n−) substrates are doped with p-type (and n-type) dopants in a range of about $10^{15}$ to about $10^{18}$ dopants per cubic centimeter. The p− (and n−) wells are doped with corresponding dopants in a range of about $10^{15}$ to about $10^{18}$ dopants per cubic centimeter. The p+ and n+ regions are doped with corresponding dopants in a range of about $10^{18}$ to about $10^{21}$ dopants per cubic centimeter. The techniques used to fabricate the structures described herein are all commercially available from commercial fabricators producing logic CMOS integrated circuits and hence are well within the skill of those of ordinary skill in the art. Conductive elements may be made of metal, silicide or heavily doped (on the order of about $10^{21}$ dopants per cubic centimeter) polycrystalline silicon (poly or polysilicon herein). While silicon dioxide ($SiO_2$) is contemplated to be a common dielectric for use as the insulator in isolating the floating gates of the present invention from each other and from the substrate and its wells, other insulator materials may be used alone, or in combination with $SiO_2$. Insulators may be formed from silicon dioxide, nitrided oxide, nitride, oxide/nitride composite, titanium oxide, tantalum oxide, zirconium oxide, hafnium oxide, lanthanum oxide (or any oxide of a lanthanide), titanium silicate, tantalum silicate, zirconium silicate, hafnium silicate and lanthanum silicate (or any silicate of a lanthanide), any combination of the above dielectrics, or other insulating materials as are known or as may become known to those skilled in the art. For insulators formed from silicon dioxide, thicknesses in the range of about 70 Å to about 200 Å are typical for nonvolatile storage, whereas thicknesses in the range of about 10 Å to about 50 Å are typical for pseudo-nonvolatile storage. Other insulator materials will have different thickness values. Accordingly, additional fabrication details will not be recited herein except where deemed important to the disclosure in order to avoid overcomplicating the disclosure.

Figure 2A:
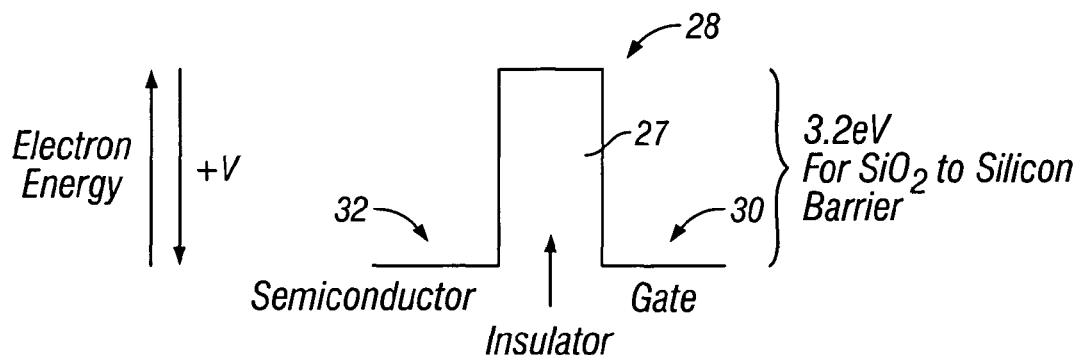
FIGS. 2A, 2B, and 2C are electron band diagrams illustrating the difference between FN tunneling and direct tunneling of electrons through an insulating barrier.
Figure 2B:
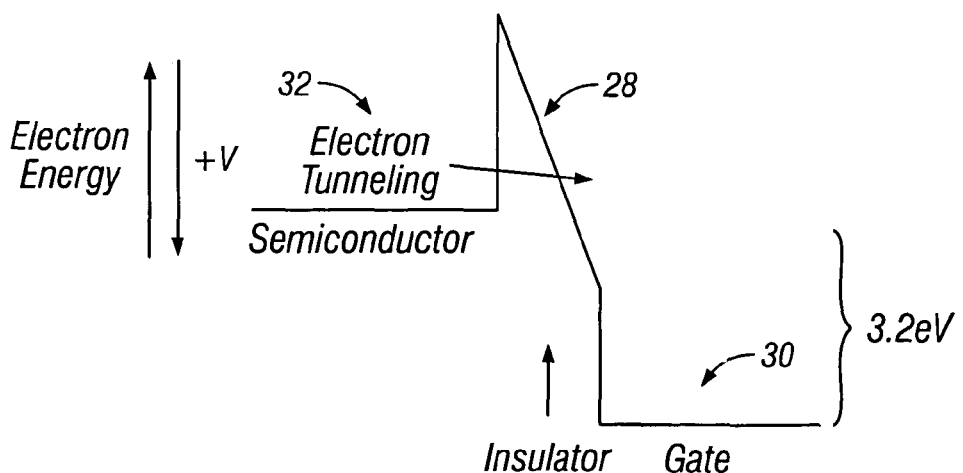
Figure 2C:
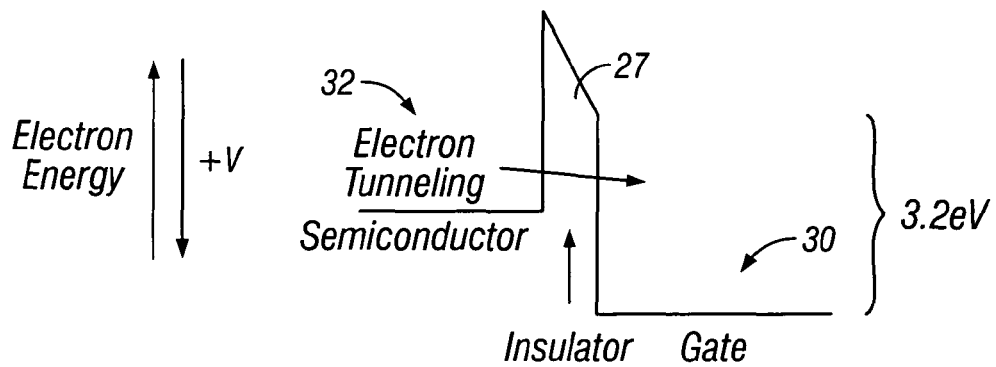
Figure 2D:
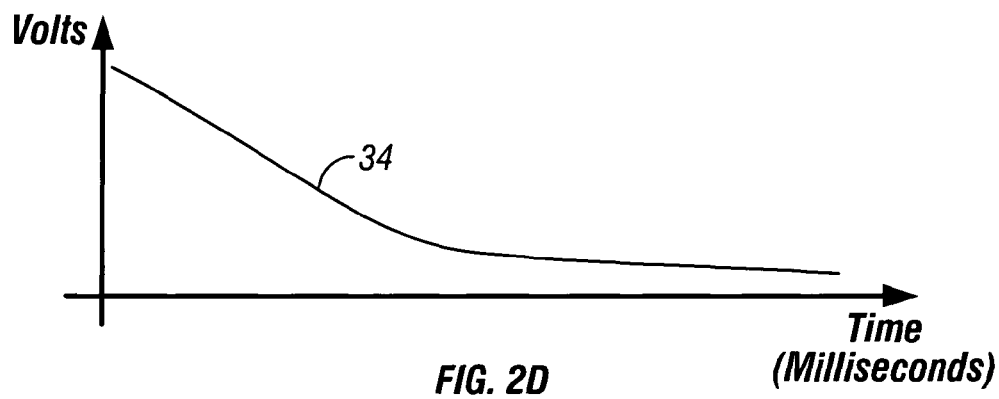
FIGS. 2D, 2E, and 2F are plots of charge decay versus time for various types of charge-based semiconductor memory devices.
Figure 2E:
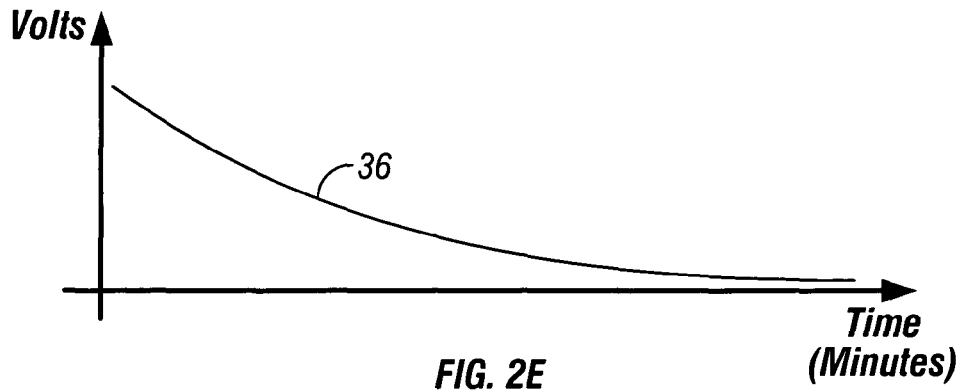
Figure 2F:
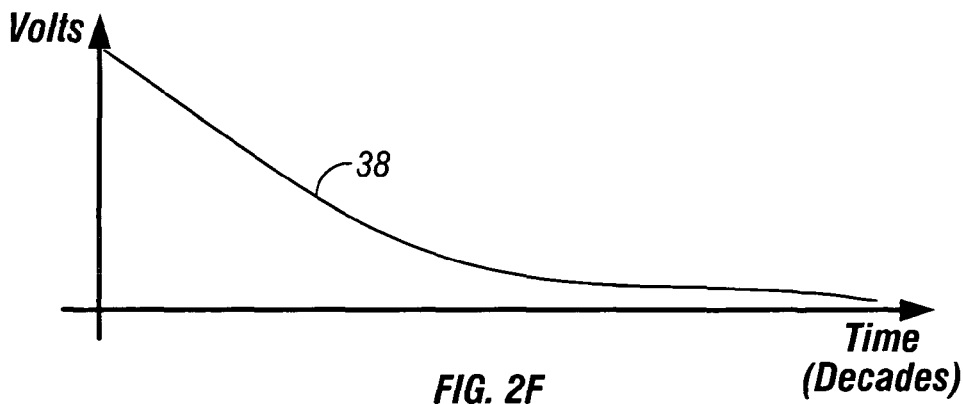

FIGS. 2D, 2E, and 2F are plots of charge decay versus time for various types of charge-based semiconductor storage devices. These plots illustrate the enormous differences in retention time for various types of semiconductor storage. In each case there is a similar-appearing decay curve; but the time constants for each of the three curves differ dramatically. For prior-art non-floating-gate capacitive storage elements with pn-junction based charging/discharging circuitry (FIG. 2D, curve 34), charge leakage off the capacitor is relatively rapid, and such devices are usually refreshed every few microseconds to milliseconds. An example of prior-art capacitive storage is the well-known dynamic random-access memory (DRAM), where a semiconductor junction is used to charge and/or discharge a capacitor. For prior-art nonvolatile storage devices (FIG. 2F, curve 38), the charge-storage element is insulated from active semiconductor material and the insulating dielectric surrounding the charge-storage element is too thick for appreciable direct-tunneling leakage to occur; hence charge leakage is extremely slow, and information retention is usually guaranteed for a decade and may in fact be much longer. For the present invention (FIG. 2E, curve 36), retention time is intermediate between these two extremes; charge leakage is slow enough that information is retained for milliseconds to hours, but it must be refreshed or regenerated to be usable over longer intervals.

Figure 3A:
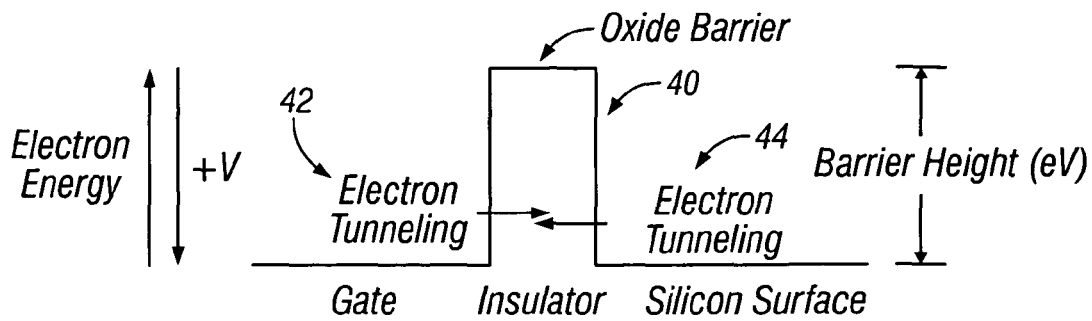
FIGS. 3A, 3B, and 3C are electron band diagrams for direct tunneling of electrons through a thin insulating barrier.
Figure 3B:
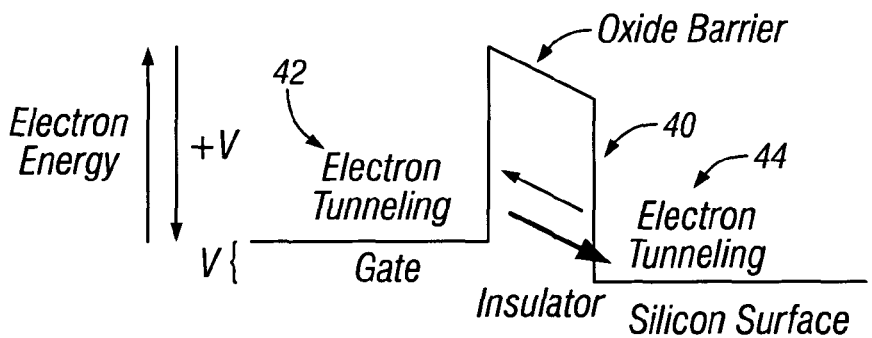
Figure 3C:
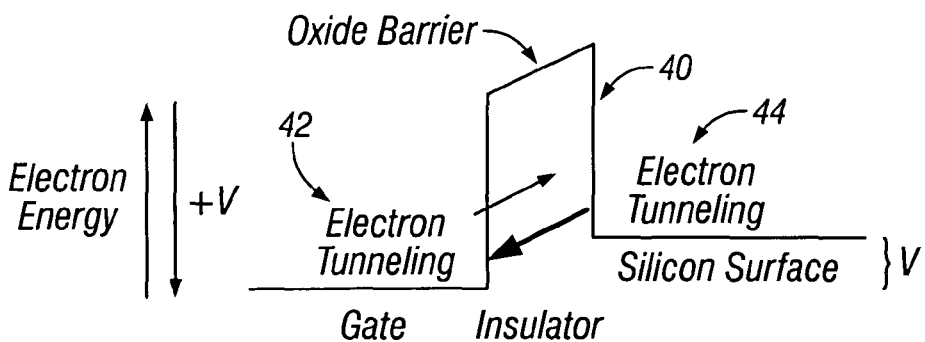

FIGS. 3A, 3B, and 3C are electron band diagrams for direct tunneling of electrons through a thin insulating barrier 40, illustrating the operation of a direct tunneling system under three different voltage conditions. In each case, the X-axis is physical distance and the Y-axes are voltage and electron energy; voltage is directly proportional to electron energy with the constant of proportionality being the unit electronic charge e−. Tunneling is a basic quantum-mechanical phenomenon in which an electron, according to its wave nature, has a certain probability of traversing a physical insulating barrier without ever having to acquire enough energy according to its particle nature to surmount the barrier. The probability of electron tunneling increases exponentially as the barrier thickness is decreased. The barrier here is an insulating layer, interposed between the gate and the silicon surface, and in the present invention is thin enough that there is a reasonable probability of electron tunneling over millisecond to second timescales. In FIG. 3A, the voltage potentials on either side of the insulating barrier are the same; thus, although there are tunneling electrons flowing in each direction, the average quantities are equal and opposite and cancel with no net current flow. In FIG. 3B, the gate 42 is at a lower voltage potential than the silicon surface 44, and so the electron flow from the gate 42 to the silicon surface 44 is larger than the opposite electron flow; consequently there is a net electron flow relocating electrons from the gate 42 to the silicon surface 44. In FIG. 3C this voltage-potential situation is reversed, so that there is a net flow of electrons being relocated from the silicon surface 44 to the gate 42.

Figure 4A:
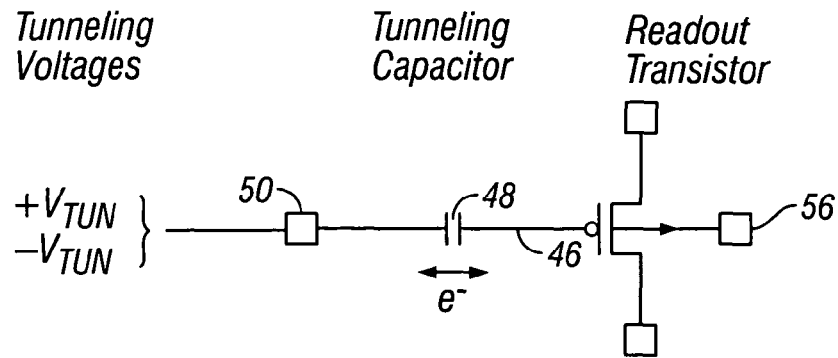
FIGS. 4A, 4B, 4C, and 4D are simplified electrical schematic diagrams illustrating four basic circuit configurations for charging and/or discharging a floating gate by means of direct tunneling through a capacitor in accordance with embodiments of the present invention.
Figure 4B:
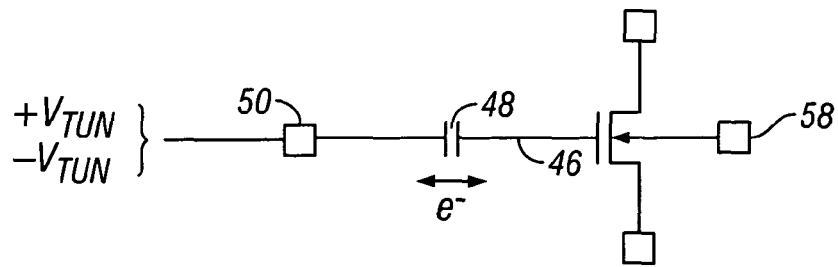

FIGS. 4A, 4B, 4C, and 4D are simplified electrical schematic diagrams illustrating four basic circuit configurations for charging and/or discharging a floating gate 46 by means of direct tunneling in a capacitor, in accordance with embodiments of the present invention. In all FIGS. 4A, 4B, 4C, and 4D, there is a tunneling voltage $V_{TUN}$ that must be available both as a positive voltage $+V_{TUN}$ and as a negative voltage $-V_{TUN}$, with $+V_{TUN}$ and $-V_{TUN}$ typically being symmetric around the floating-gate voltage $V_{fg}$ 46, although there is no requirement that $+V_{TUN}$ and $-V_{TUN}$ must necessarily be symmetric about $V_{fg}$. Furthermore, although FIGS. 4A, 4B, 4C, and 4D all show bidirectional direct tunneling in accordance with one embodiment of the present invention, it will be obvious to those skilled in the art that a combination of direct tunneling and conventional hot-electron injection is also possible, where tunneling removes electrons from the floating gate and injection adds them. In the circuits of FIGS. 4A and 4B there is a single tunneling capacitor 48 connected to a voltage source 50 which is switchable between $+V_{TUN}$ and $-V_{TUN}$, with tunneling occurring in either direction between the voltage source 50 and the floating gate 46 depending on which of $+V_{TUN}$ and $-V_{TUN}$ is selected; whereas, in FIGS. 4C and 4D there are two tunneling capacitors 52 and 54, one connected to $+V_{TUN}$ during the tunneling of electrons off the floating gate 46 and the other connected to $-V_{TUN}$ during the tunneling of electrons onto the floating gate 46. In the devices illustrated in FIGS. 4A and 4C the readout transistor is a pFET (p-channel field effect transistor), considered to be a four-terminal device, with its well contact 56 being the fourth terminal (the others being source, drain and floating gate); whereas, in the devices illustrated in FIGS. 4B and 4D, the readout transistor is an nFET (n-channel field effect transistor), likewise considered to be a four-terminal device, with its well contact 58 being the fourth terminal (the others being source, drain and floating gate). In these cases, the readout transistor's gate insulator (usually silicon dioxide, $SiO_2$, in CMOS processes) typically is fabricated to be sufficiently thick such that little or no tunneling occurs in the readout transistor under normal circuit operating voltages. This latter constraint is not the case in all embodiments disclosed herein.

FIGS. 5A, 5B, 5C, 5D, 5E, 5F, and 5G are side elevational cross-sectional drawings of a few of the many possible implementations of a tunneling capacitor in accordance with embodiments of the present invention. Many other embodiments will now be obvious to those of ordinary skill in the art.

Figure 5A:
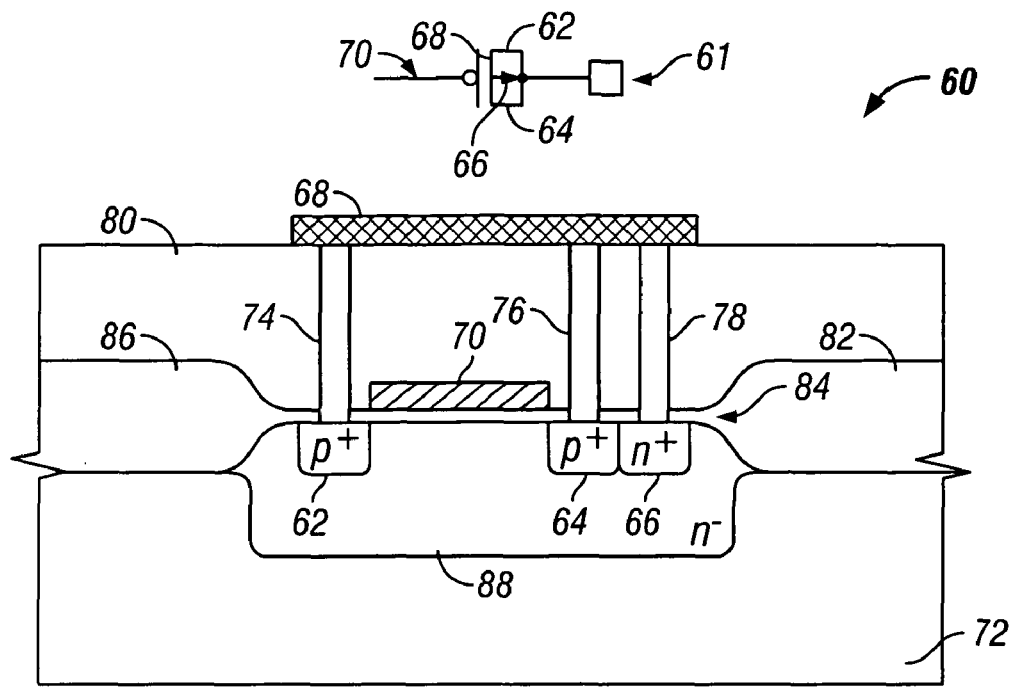
FIGS. 5A, 5B, 5C, 5D, 5E, 5F, and 5G are schematic drawings and corresponding side elevational cross-sectional drawings of a few of the many possible implementations of a tunneling capacitor in accordance with embodiments of the present invention.
Figure 5B:
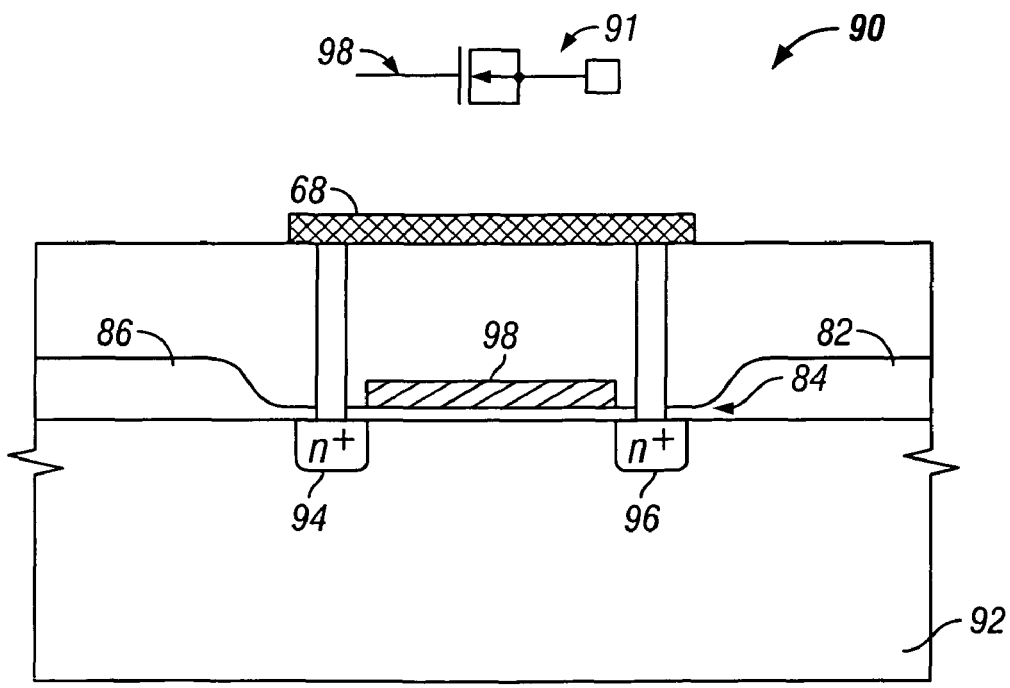
Figure 5C:
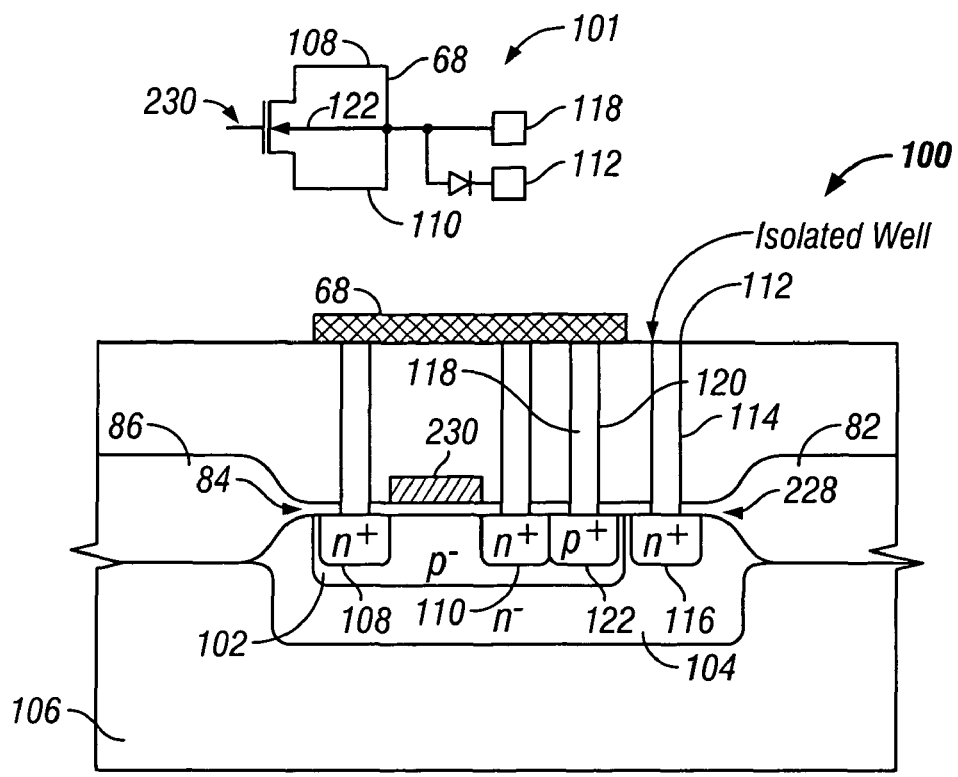
Figure 5F:
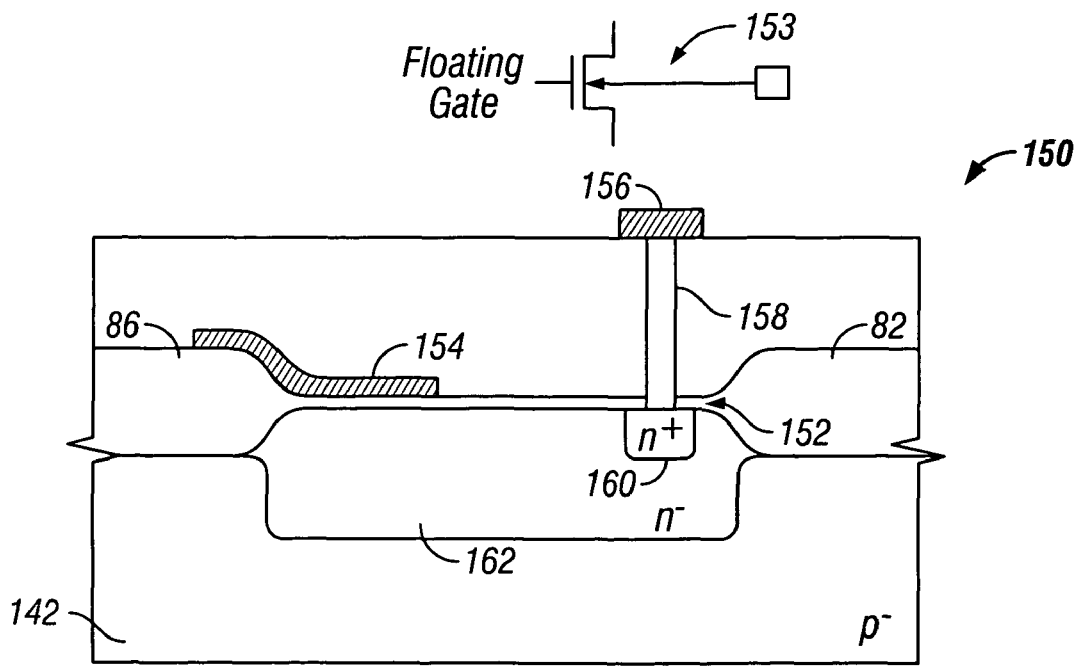

Turning now to FIG. 5A, in all cases shown except for the one in FIG. 5F, the tunneling capacitor implementation comprises one or two four-terminal MOSFETs 60, each with two or three of its four terminals (some combination of source 62, drain 64, and well 66) typically shorted together by metal interconnect 68 (this shorting function could be accomplished with other conductive elements as well as will now be appreciated by those of ordinary skill in the art). The shorted-together regions comprise one plate of the capacitor, and the floating gate 70 comprises the other plate. In all cases shown, the substrate 72 is p– type material, and there are p+ (62, 64) and n+ (66) ohmic contacts with vertical metal vias 74, 76, 78 leading up through an interlayer dielectric (ILD) 80 material to metal interconnect 68. There may in fact be additional layers of ILD material penetrated by metal vias, and also additional metal layers intervening between these ILD layers, but these additional layers are not shown in order to avoid over-complicating the disclosure. On top of the substrate there is an insulating layer 82, frequently but not necessarily silicon dioxide, which varies in thickness; it is very thin (and is referred to as 'gate oxide') in those regions 84 where a MOSFET is being created, and much thicker (and referred to as 'field oxide' or as 'shallow trench isolation') in between MOSFETs 86 in order to weaken the coupling between MOSFETs to the point where coupling effects may be disregarded. In MOSFET gate regions, a polysilicon layer on top of the thin gate-oxide layer 84 forms a floating gate 70.

FIG. 5A illustrates a single pFET 60 as a tunneling capacitor, formed within an n-type well 88. An equivalent schematic diagram of device 60 is shown at 61.

FIG. 5B illustrates a single nFET as a tunneling capacitor 90, fabricated in the p-type substrate 92. Electron tunneling occurs between the shorted source/drain implants 94, 96 and the floating gate 98. The shorted n+ source 94 and drain 96 of the nFET may not be pulled to a potential below the p– substrate 92, otherwise the pn-junction diodes formed between the substrate and source/drain diffusions would become forward biased and conduct. An equivalent schematic diagram of device 90 is shown at 91.

FIG. 5C shows a single nFET as a tunneling capacitor 100, here formed within a p– type well 102 which is, in turn, completely enclosed within an n– type well 104 in order to isolate the p-type well 102 electrically from the main p-type substrate 106. An equivalent schematic diagram of device 100 is shown at 101. In this implementation, the source 108 and drain 110 may be pulled below the substrate voltage by judiciously biasing the isolated n– well 104 (via contact 112, via 114 and n+ region 116) and p– well 102 (via contact 118, via 120 and p+ region 122) such that no diode junctions will be conducting.

Figure 5D:
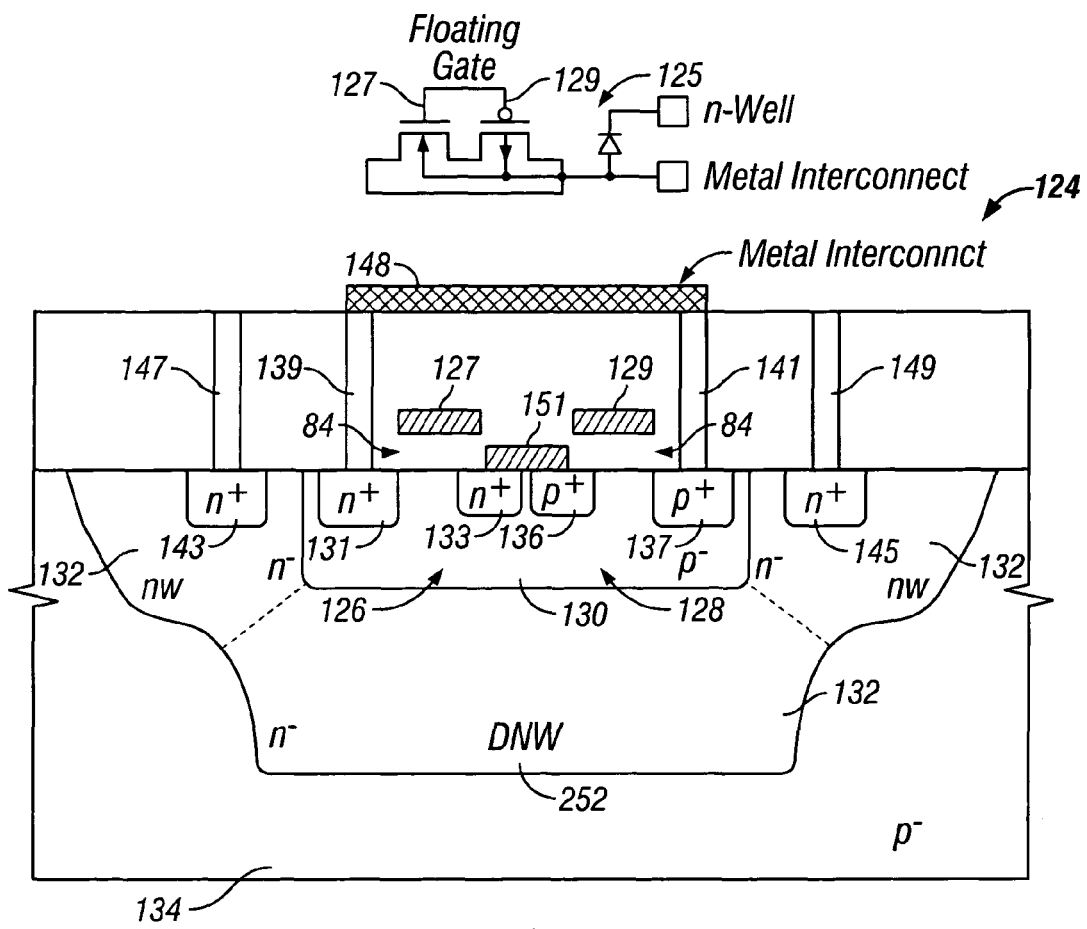

FIG. 5D illustrates a circuit implementation 124 using two floating-gate tunneling capacitors 126, 128 in parallel, one pFET 128 and one nFET 126, formed within a p– type well 130 which is, in turn, completely enclosed within an n– type well 132 in order to isolate the p– type well 130 electrically from the main p– type substrate 134; such a combination still functions as a capacitor, and may have more desirable capacitance-versus-voltage characteristics than a single MOSFET device used in this role. An equivalent schematic diagram of device 124 is shown at 125. This architecture is referred to a deep n– well or "DNW". Floating gate 127 is part of nFET 126 and floating gate 129 is part of pFET 128. Floating gate 127 and 129 are coupled together as shown in schematic 125. The n+ regions 131 and 133 from the drain and source, respectively, of nFET 126. The p+ regions 135 and 137 from the source and draining respectively, of pFET 128. Drains 131 and 137 are coupled with vias 139, 141, respectively, to interconnect 148. Well contacts 143, 145 are coupled to vias 147, 149, respectively. Interconnect 151 couples sources 133 and 135.

Figure 4C:
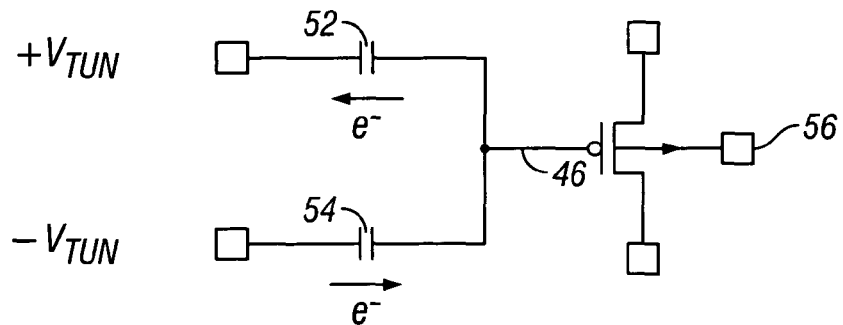
Figure 4D:
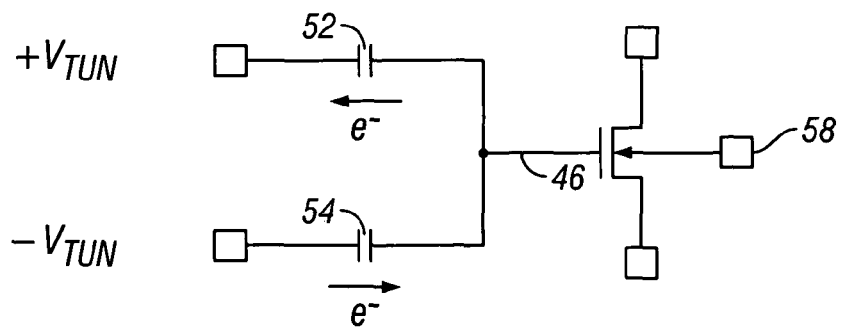
Figure 5E:
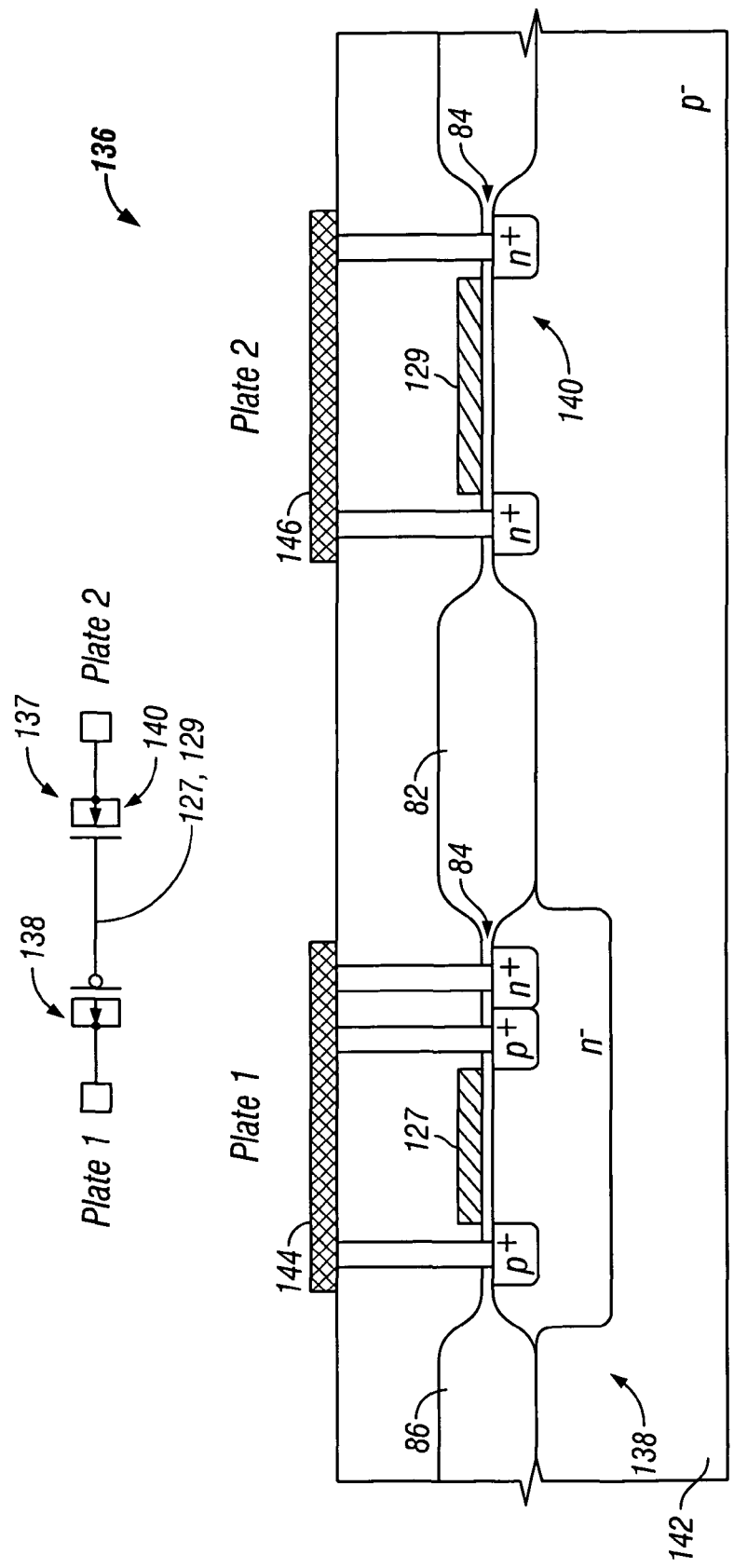

FIG. 5E illustrates a circuit implementation 136 using two floating-gate tunneling capacitors 138, 140 in parallel, one pFET 138 and one nFET 140, like the circuit implementation illustrated in FIG. 5D except that the nFET 140 is formed within the p– substrate 142 rather than in an isolated p– type well region 130; and the first plates 144, 146 of the individual tunneling capacitors are separate terminals in accordance with FIGS. 4C and 4D, rather than being a single plate 148 as in device 124 of FIG. 5D. An equivalent schematic diagram of device 136 is shown at 137.

FIG. 5F illustrates an nMOS 'bowl-shaped capacitor' device 150, which is not strictly an nFET because it lacks any source or drain diffusion. An equivalent schematic diagram of device 150 is shown at 153. This structure may be fabricated with additional dopant atoms in the n– well material underlying the thin gate oxide 152, as could be done for all the structures of FIGS. 5A, 5B, 5C, 5D, 5E, 5F, and 5G, but this additional layer is not shown in order to avoid over-complicating the disclosure. In the FIG. 5F device 150 there is a polysilicon floating gate 154, a well contact 156 coupled through via 158 to an n+ region 160 in n– well 162.

Figure 5G:
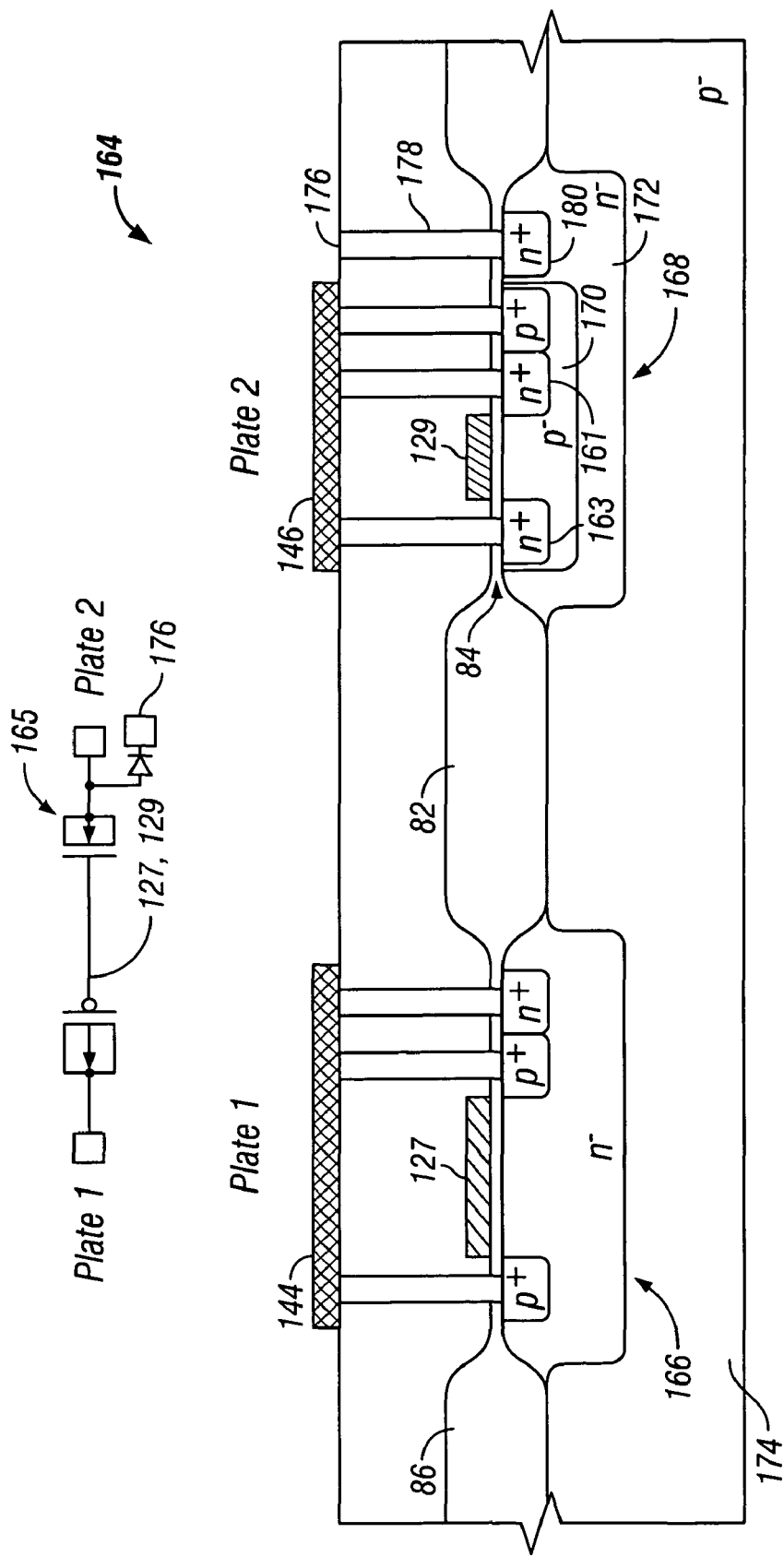

The device 164 illustrated in FIG. 5G is similar to that illustrated in FIG. 5E. The tunneling capacitors 166, 168 are in parallel, one pFET 166 and one nFET 168, but here the nFET 168 is formed within a p– type well 170 which is, in turn, completely enclosed within an n– type well 172 in order to isolate the p– type well 170 electrically from the main p– type substrate 174. An equivalent schematic diagram of device 164 is shown at 165. In this implementation, the nFET 168 source and drain 161, 163 may be pulled below the substrate voltage by judiciously biasing the isolated n– well 172 (via contact 176, via 178, and n+ region 180) and p– well 170 such that no diode junctions will be conducting, just like in device 100 of FIG. 5C.

Figure 6A:
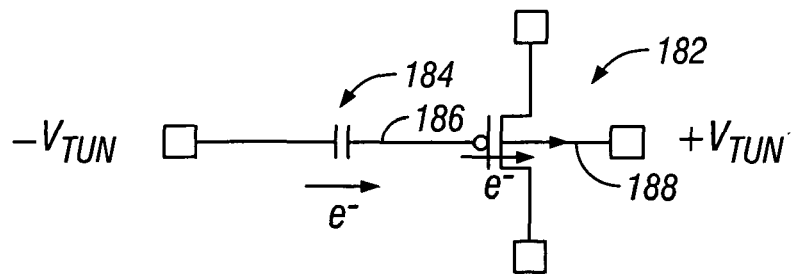
FIGS. 6A, 6B, 6C, 6D, and 6E are electrical schematic diagrams illustrating circuits in which a pFET readout transistor is itself used to implement one or both of the direct tunneling operations to charge and/or discharge its own floating gate in accordance with embodiments of the present invention.
Figure 6B:
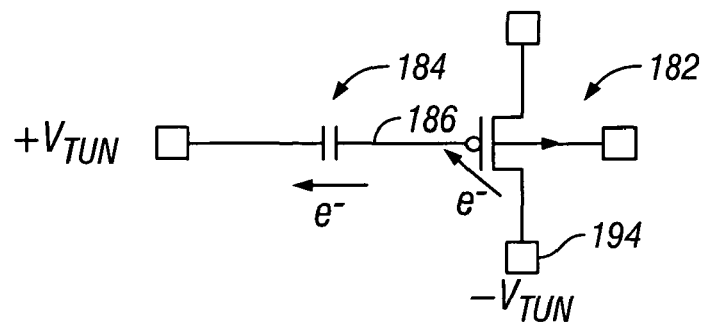
Figure 6C:
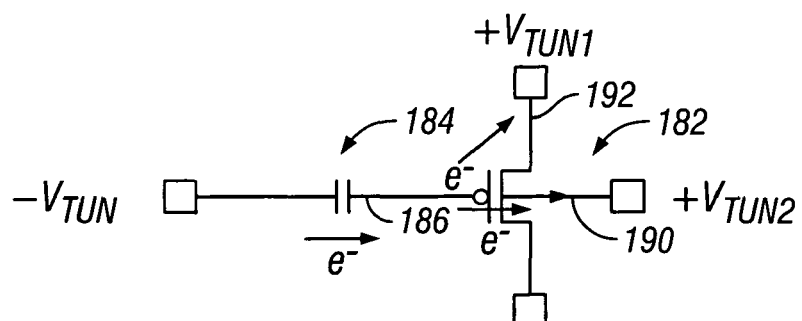
Figure 6D:
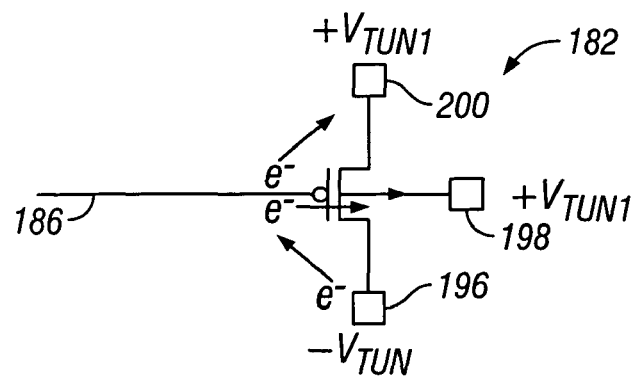
Figure 6E:
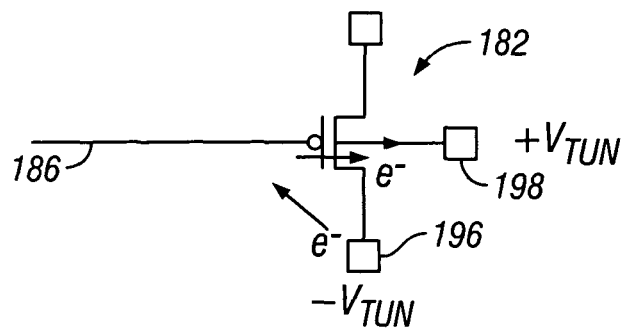

FIGS. 6A, 6B, 6C, 6D, and 6E are electrical schematic diagrams illustrating circuits in which a pFET readout transistor 182 is itself used to implement one or both of the direct tunneling operations, adding electrons to and/or removing electrons from its own floating gate in accordance with embodiments of the present invention. The readout pFET is assumed to have a gate oxide sufficiently thin that direct electron tunneling occurs as shown in FIGS. 3B and 3C. In the circuits illustrated in FIGS. 6A, 6B, and 6C a tunneling capacitor 184 is used for one of the two electron-transfer directions (adding or removing), and the readout transistor itself is used for the other electron-transfer direction. In the circuits illustrated in FIGS. 6D and 6E no tunneling capacitor is used, and the readout transistor 182 itself is used for both electron-transfer directions. In the circuits illustrated in FIGS. 6A and 6C, the tunneling capacitor is connected to $-V_{TUN}$; the tunneling capacitor is used to add electrons to the floating gate 186, and the removal of electrons is done by applying $+V_{TUN}$ to the readout pFET's well 188 in the circuit illustrated in FIG. 6A, and to the readout pFET's well 190 and/or the source 192 in the circuit illustrated in FIG. 6C. The voltages on the well 190 and source 192 in FIG. 6C typically are similar, but they do not have to be the same; hence they are labeled $+V_{TUN1}$ and $+V_2$. Recall also that the voltages $+V_{TUN}$ and $-V_{TUN}$ need not be symmetric about the floating-gate voltage. FIG. 6B illustrates an implementation that is the dual to that of FIG. 6A, where in the circuit illustrated in FIG. 6B adding electrons to the floating gate 186 is accomplished by connecting the readout pFET's drain 194 to $-V_{TUN}$, and removing electrons is accomplished by connecting the tunneling capacitor 184 to $+V_{TUN}$. In the circuits illustrated in FIGS. 6D and 6E the readout pFET's drain 196 is connected to $-V_{TUN}$ and is used to add electrons to the floating gate 186; in both cases the readout pFET's well 198 is connected to $+V_{TUN}$ to remove electrons. In the circuit illustrated in FIG. 6D the readout pFET's source 200 is also connected to $+V_{TUN}$ and can remove electrons from the floating gate 186 in concert with, or instead of, the well connection. Again, the voltages on the well 198 and source 200 in FIG. 6D typically are similar but they do not have to be the same, and hence they are labeled $+V_{TUN1}$ and $+V_{TUN2}$. The tunneling capacitors here may be any of those structures illustrated in FIGS. 5A, 5B, 5C, 5D, 5E, 5F, and 5G, as well as others, which will now be apparent to those of ordinary skill in the art.

Figure 7A:
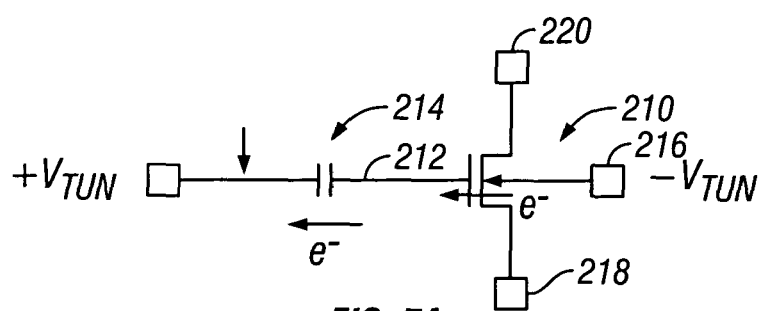
FIGS. 7A, 7B, 7C, 7D, and 7E are electrical schematic diagrams illustrating circuits in which a nFET readout transistor is itself used to implement one or both of the direct tunneling operations to charge and/or discharge its own floating gate in accordance with embodiments of the present invention.
Figure 7B:
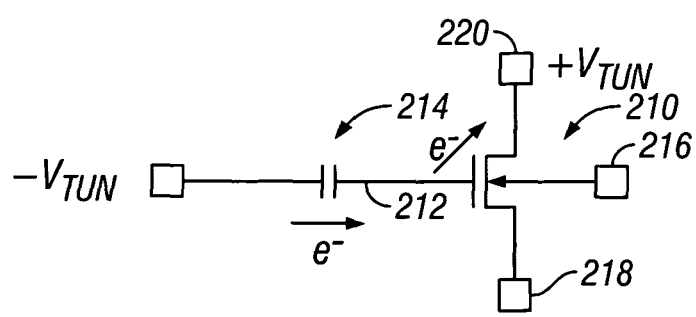
Figure 7C:
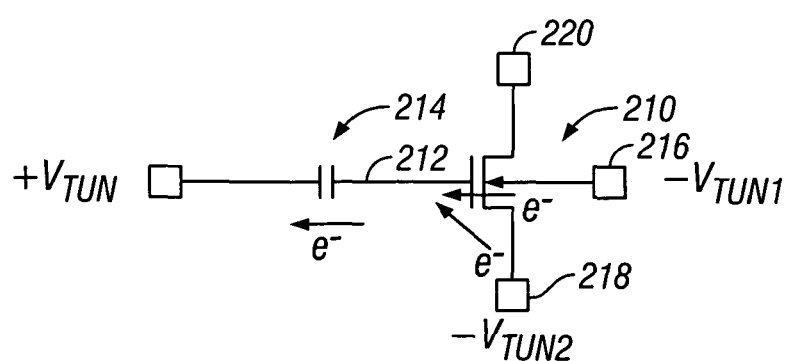
Figure 7D:
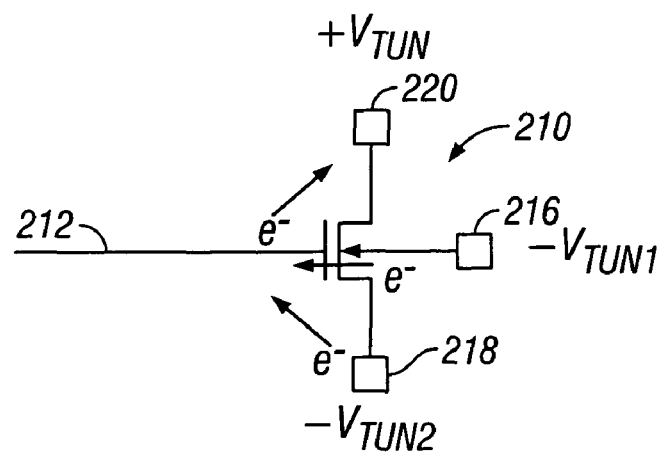
Figure 7E:
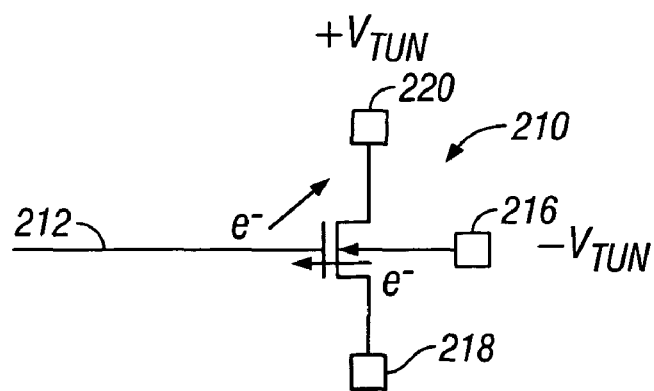

FIGS. 7A, 7B, 7C, 7D, and 7E are electrical schematic diagrams illustrating circuits in which an nFET readout transistor 210 is itself used to implement one or both of the direct tunneling operations, adding electrons to and/or removing electrons from its own floating gate 212 in accordance with embodiments of the present invention. The readout nFET 210 is assumed to have a gate oxide sufficiently thin that direct electron tunneling occurs as shown in FIG. 3. FIGS. 7A, 7B, 7C, 7D, and 7E are the duals of FIGS. 6A, 6B, 6C, 6D, and 6E, replacing the pFETs 182 in FIG. 6 with nFETs 210 in FIG. 7, and inverting the directions of electron flow as appropriate. In the circuits illustrated in FIGS. 7A, 7B, and 7C a tunneling capacitor 214 is used for one of the two electron-transfer directions (adding or removing), and the readout transistor 210 itself is used for the other electron-transfer direction. In the circuits illustrated in FIGS. 7D and 7E no tunneling capacitor is used, and the readout transistor 210 itself is used for both electron-transfer directions. In the circuits illustrated in FIGS. 7A and 7C, the tunneling capacitor 214 is connected to $+V_{TUN}$; the tunneling capacitor is used to remove electrons from the floating gate, and adding electrons to the floating gate 212 is done by applying $-V_{TUN}$ to the readout nFET's well 216 in FIG. 7A, and to the readout nFET's well 216 and/or source 218 in FIG. 7C. The voltages on the well 216 and source 218 in FIG. 7C typically are similar, but they do not have to be precisely the same; hence they are labeled $-V_{TUN1}$ and $-V_{TUN2}$. The circuit of FIG. 7B shows an implementation that is the dual to that of FIG. 7A, where removing electrons is done by connecting the readout nFET's drain 220 to $+V_{TUN}$, and adding electrons is done by connecting the tunneling capacitor 214 to $-V_{TUN}$. In the circuits of FIGS. 7D and 7E the readout nFET's drain 220 is connected to $+V_{TUN}$ and is used to remove electrons from the floating gate 212; in both cases the readout nFET's well 216 is connected to $-V_{TUN}$ to add electrons. In the circuit of FIG. 7D the readout nFET's source 218 is also connected to $-V_{TUN}$, and adds electrons to the floating gate 212 in concert with, or instead of, the well connection 216. Again, the voltages on the well 216 and source 218 in FIG. 7D typically are similar but need not be the same, and hence are labeled $-V_{TUN1}$ and $-V_{TUN2}$. The tunneling capacitors 214 may be any of those structures shown in FIGS. 5A, 5B, 5C, 5D, 5E, 5F, and 5G, as well as others, which will now be apparent to those of ordinary skill in the art.

Figure 8A:
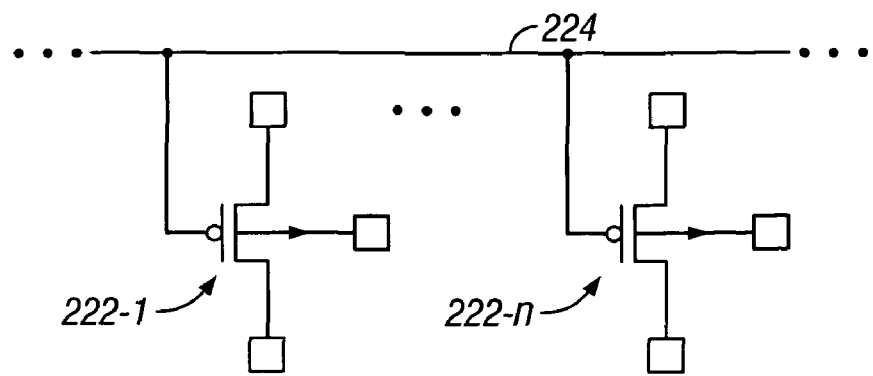
FIGS. 8A, 8B, 8C, and 8D are electrical schematic diagrams illustrating embodiments of the present invention in which one or more MOSFETs, capacitors, or other insulated devices may be connected to a floating gate.
Figure 8B:
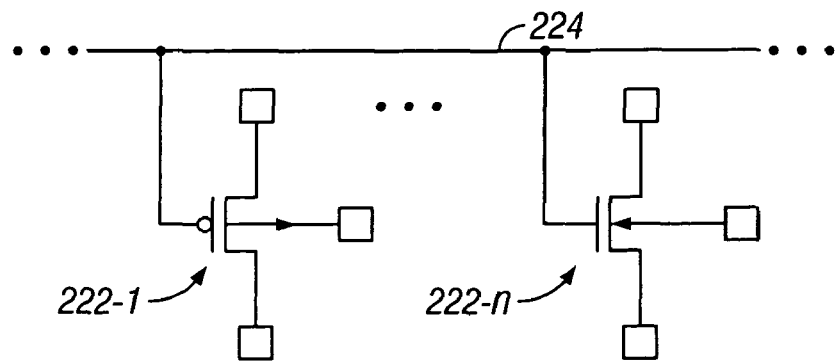
Figure 8C:
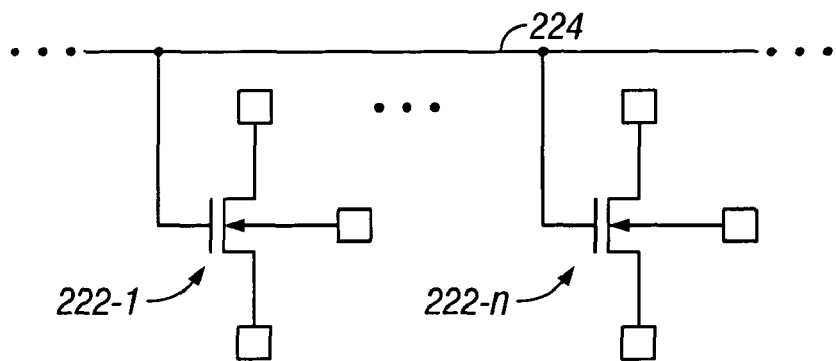
Figure 8D:
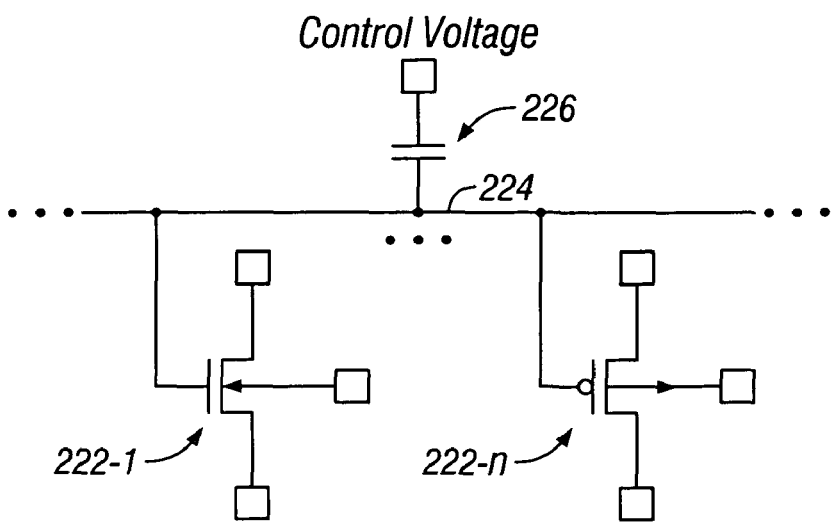

FIGS. 8A, 8B, 8C, and 8D are electrical schematic diagrams illustrating embodiments of the present invention in which one or more readout MOSFETs-222-1, . . . , 222-n (as well as any of the capacitor embodiments already described) may be connected to a single floating gate or floating node 224. The only restriction here is that the common electrical point for these multiple floating gates should not connect to any circuit element having insulation less efficacious than the tunneling oxide. Circuit elements suitable for adding electrons to and or removing electrons from these electrically common floating gates may be any of those already described. There is no restriction on mixing the floating gates of pFETs with those of nFETs: FIG. 8A illustrates multiple pFETs, FIG. 8B illustrates multiple pFETs mixed with multiple nFETs, FIG. 8C illustrates multiple nFETs, and FIG. 8D illustrates multiple pFETs, multiple nFETs, and one or more coupling capacitors 226 tied to floating gate or floating node 224. These coupling capacitors may be tunneling capacitors as disclosed herein, poly-insulator-poly capacitors not located physically above any of the devices 221-1 to 221-*n*, metal-insulator-metal capacitors, pFETs or nFETs configured as MOS-capacitors (MOSCAPs), or any of the many capacitive structures well known to those skilled in the art.

Figure 9:
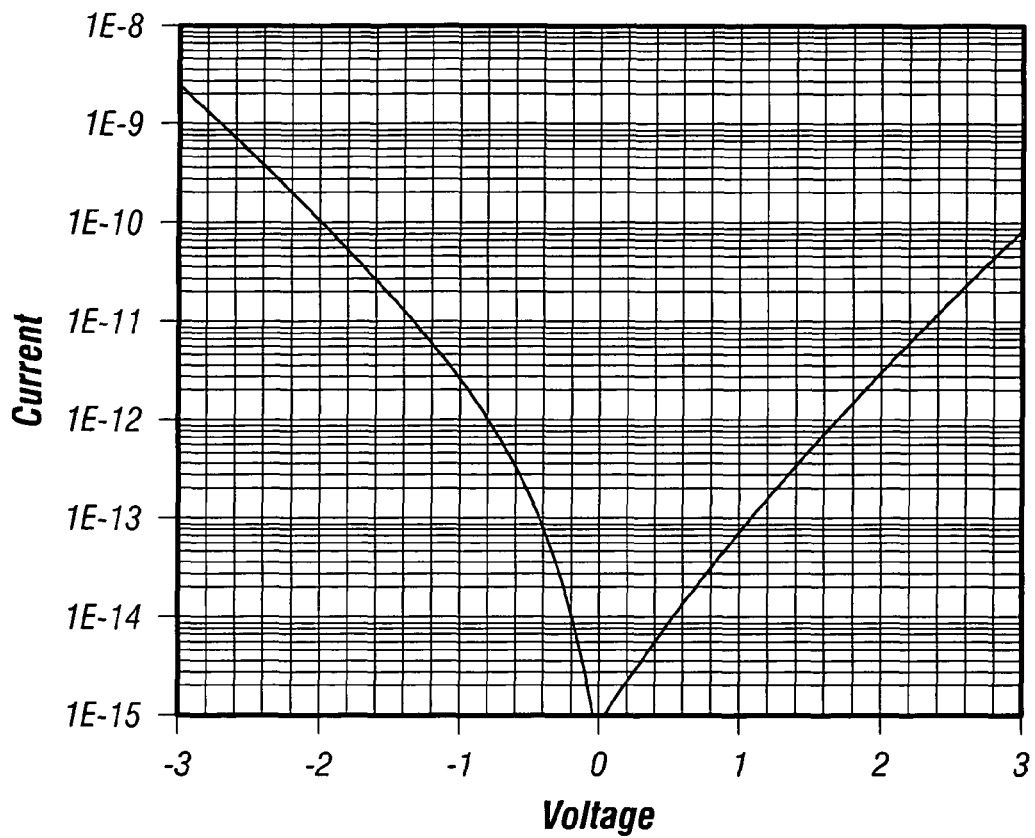
FIG. 9 is a semilog plot of the current-voltage (I-V) characteristics of the circuit of FIG. 5C.

FIG. 9 is a semilog plot of the I-V characteristics of the circuit of FIG. 5C, a tunneling capacitor comprising an nFET 100 in an isolated p-well 102, where the X-axis represents the voltage across the insulator 228, and the Y-axis represents the absolute value of the tunneling current through the insulator 228. The two plates of the tunneling capacitor are (1) the floating gate 230; and (2) the isolated p-well 102, with the nFET's drain 108 and source 110 terminals shorted to (i.e. held at the same potential as) the isolated p-well 102. The tunneling current increases by many orders of magnitude as the insulator voltage increases or decreases about zero. The region to the left of zero (i.e. gate voltage<p-well voltage) is where accumulation occurs in the p-type well, meaning that mobile holes are attracted by the negatively-charged gate 230 and build up as a hole-rich layer directly under the gate insulator 228. The region to the right of zero (i.e. gate voltage>p-well voltage) is where inversion occurs in the p-type well 102, meaning that mobile electrons are attracted by the positively-charged gate 230 and build up as an electron-rich layer directly under the gate insulator 228. For this circuit, the effects of accumulation and inversion upon the tunneling currents are quite asymmetrical, meaning that, for example, the tunneling current at 2V is appreciably different from the tunneling current at −2V. The curves computed by modeling and those measured under laboratory conditions are so close together that they could not be distinguished if plotted separately; thus the plot of FIG. 9 represents both.

Figure 10:
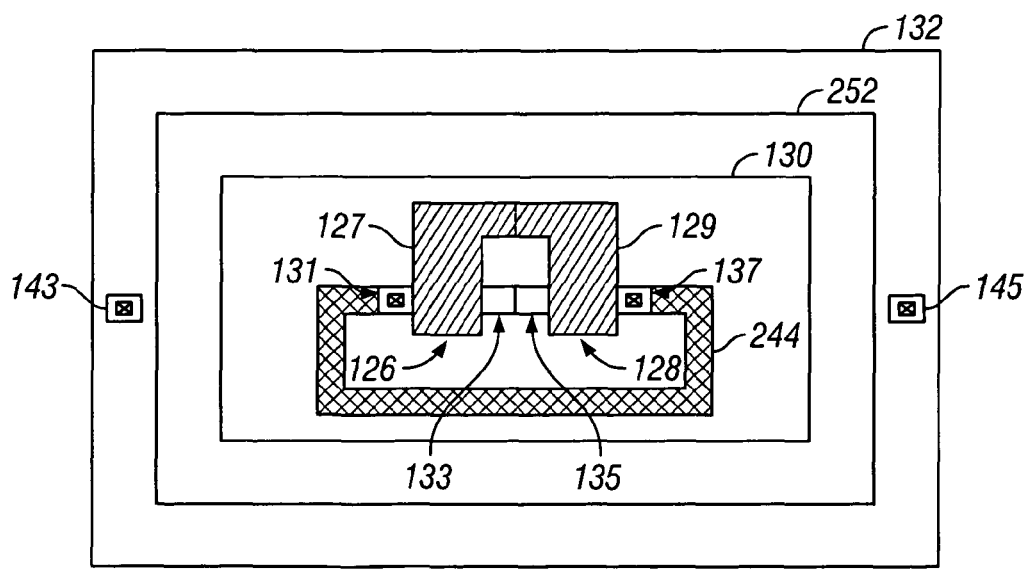
FIG. 10 is a top plan view of the layout for the circuit of FIG. 5D.

FIG. 10 is a top plan view of the layout for the tunneling capacitor 124 of FIG. 5D. Unlike device 100 illustrated in FIG. 5C, which comprises a single nFET in an isolated p-well 102, FIG. 5D comprises both an nFET 126 and a pFET 128 fabricated in an isolated p-well 130, with the two FETs 126, 128 sharing a single common floating gate 127/129 (one plate of the tunneling capacitor) and sharing a common tunneling conductor 131 (the other plate of the tunneling capacitor). The two plates of the tunneling capacitor are (1) the shorted floating gates 127 and 129, typically doped n- type and p-type, respectively, for the n- type and p- type MOSFETs; and (2) the isolated p- well 130, with the nFET's source terminal 131 shorted to the p-well 130 by a conductor 244, and the pFET's source terminal 137 shorted to the p-well 130 because it forms the ohmic contact for the p- well (p+ in p- well). The drain terminals 133 and 135 that are butted and shorted (using a silicide in one embodiment) between the nFET 126 and the pFET 128 are also at the same potential as the isolated n- well 132 and p- well 130 by reason of the floating-gate nFET or pFET channels being conductive for voltages a few hundred millivolts in either direction from zero on the graph of FIG. 11. Many other similar layout implementations are possible, but are not shown in order to avoid over-complicating the disclosure, such as electrically separating the nFET and pFET drain terminals 133, 135; contacting the nFET and pFET drain terminals 133,135 with a conductor and shorting them to the p-well 130 and source terminals 131, 137; connecting the nFET and/or pFET sources 131, 137 and/or drains 133, 135 to different conductors from the well terminals; or others as will now be apparent to those of ordinary skill in the art.

Figure 11:
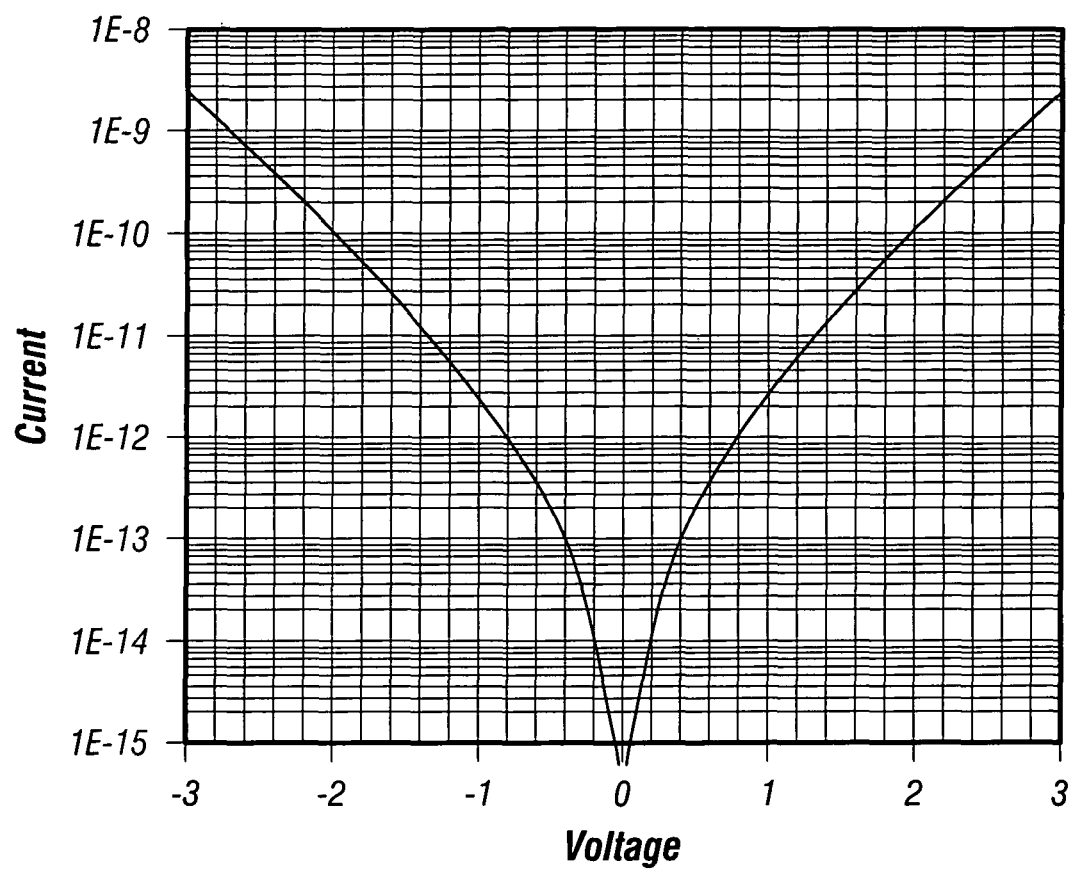
FIG. 11 is a semilog plot of the I-V characteristics of the circuit of FIGS. 5D and 10.

FIG. 11 (compare with FIG. 9) is a semilog plot of the I-V characteristics of the circuit of FIGS. 5D and 10. The X-axis represents the voltage across the insulator, and the Y-axis represents the absolute value of the tunneling current through the insulator. The tunneling current increases by many orders of magnitude as the insulator voltage increases or decreases about zero. The region to the left of the zero (i.e. gate voltage<p- well voltage) is where accumulation occurs in the p- type well, meaning that mobile holes are attracted by the negatively charged gates and build up as a hole-rich layer directly under the gate insulators. The region to the right of zero (i.e. gate voltage>well voltage) is where inversion occurs in the p-type well, meaning that mobile electrons are attracted by the positively charged gates and build up as an electron-rich layer directly under the gate insulators. Because the circuit structure of FIG. 10 is symmetrical, with one MOSFET having a p-doped gate and the other an n-doped gate, the tunneling-current versus insulator-voltage graph of FIG. 11 is also symmetric about zero volts. Because of this inherent symmetry (compare the symmetry in FIG. 11 with the asymmetry in FIG. 9), the structure of the device 124 of FIG. 5D is generally considered an improvement over the device 100 of FIG. 5C, although this improvement requires using an additional transistor and additional silicon die area. As in FIG. 9, the curves computed by modeling and those measured under laboratory conditions are so close together that they could not be distinguished if plotted separately; thus the plot of FIG. 11 represents both.

Figure 12A:
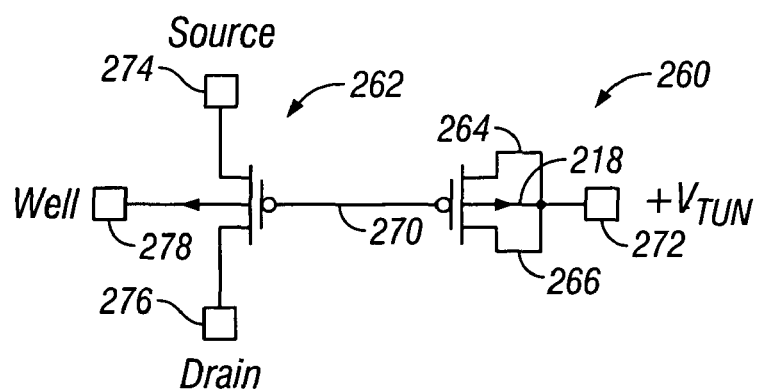
FIGS. 12A, 12B, and 12C are, respectively, an electrical schematic diagram, a side elevational cross-sectional drawing, and a top plan view of the layout for a circuit according to FIG. 6B, employing a single pMOS tunneling capacitor with a four-terminal readout pFET to form a PNVFG device in accordance with one embodiment of the present invention.
Figure 12C:
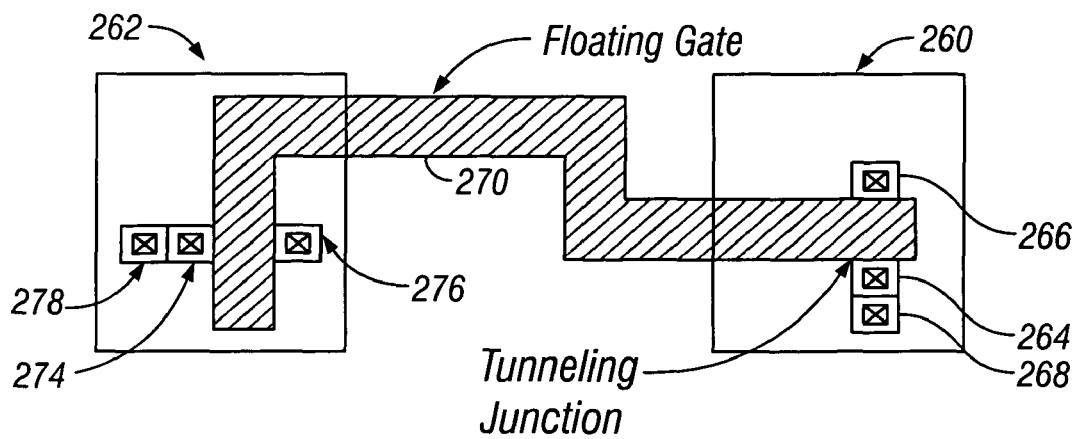
Figure 12B:
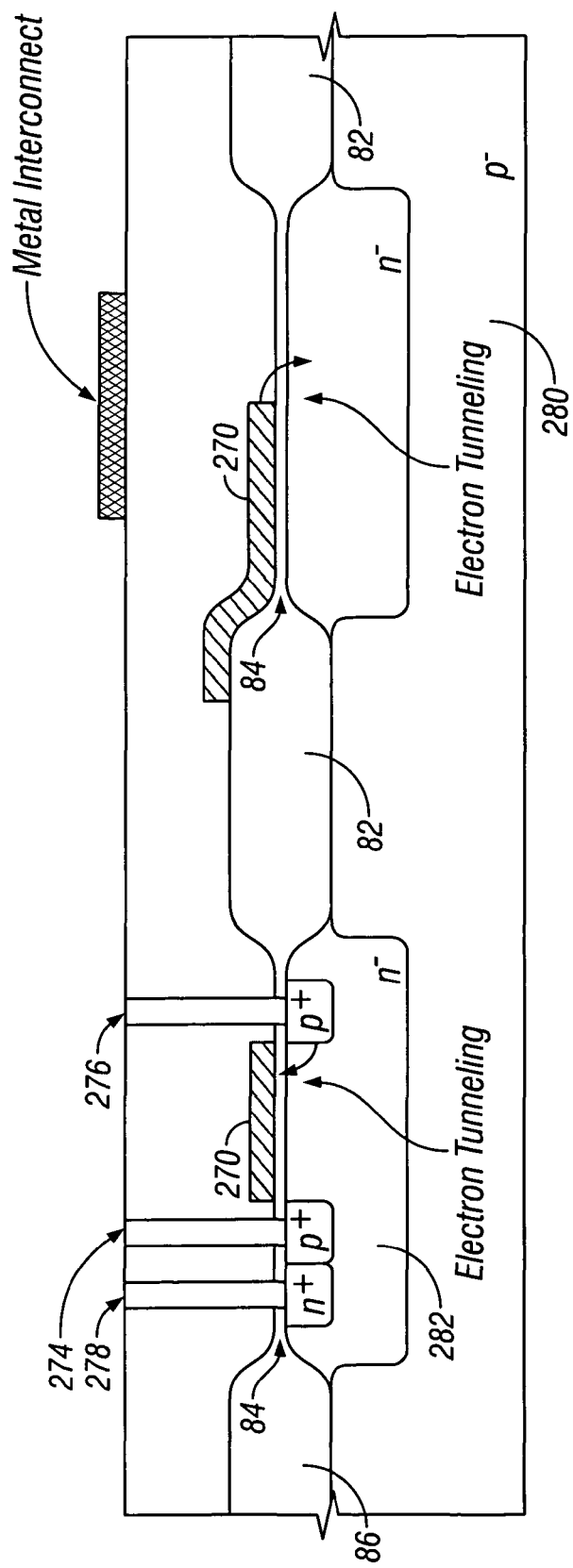

The layouts shown in FIGS. 12A, 12B, 12C; 13A, 13B, 13C; 14A, 14B, 14C; 15A, 15B, 15C; and 16A, 16B, 16C have been expanded and rearranged in order to show all features and entities more clearly. They are not realistic layouts for actual devices, which would be arranged in a considerably more compact form. Also, cross sections of some devices that are aligned up-and-down on the page, rather than across, do not show all of their regions.

FIGS. 12A, 12B, and 12C are, respectively, an electrical schematic diagram, a side elevational cross-sectional drawing, and a top plan view of the layout for a circuit that implements the structure of FIG. 6B, comprising a pFET tunneling capacitor 260 and a four-terminal readout pFET 262 to form a PNVFG charge-storage device in accordance with one embodiment of the present invention. The pFET tunneling capacitor 260 has its source 264, drain 266, and n- well 268 all shorted together to comprise one plate of the tunneling capacitor; its floating gate 270 comprises the other plate. Both transistors 260, 262 use gate insulators with oxides sufficiently thin to allow direct electron tunneling. Electrons are added to the floating gate 270 by pulling the readout pFET's drain voltage far enough below the floating-gate voltage that electrons tunnel to the floating gate 270. Electrons are removed from the pFET's floating gate 270 by raising the pFET tunneling-capacitor's n- well/drain/source voltage (at node 272) far enough above the floating-gate voltage that electrons tunnel off the floating gate 270. The readout pFET 262 has a source 274, drain 276, well contact 278 and is coupled to floating gate or node 270. Floating gate 270 is insulated from substrate (p−) 280 and n- well 282 by insulators 82 and 84 as disclosed above.

Figure 13A:
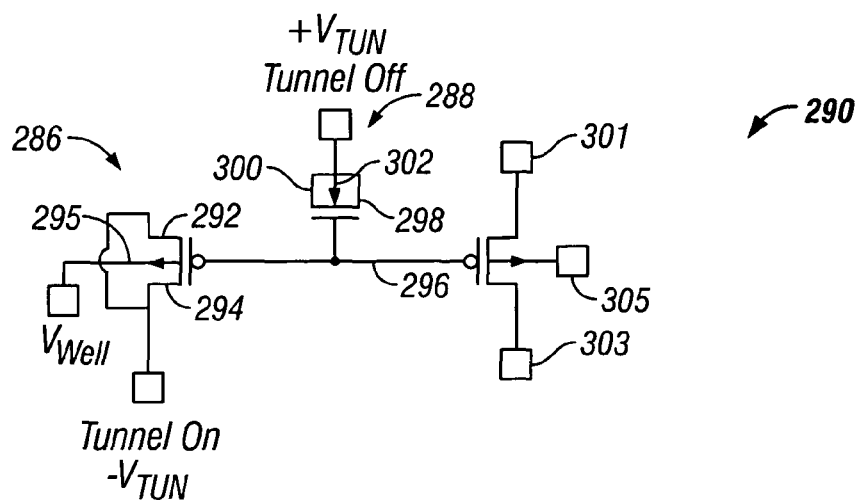
FIGS. 13A, 13B, and 13C are, respectively, an electrical schematic diagram, a side elevational cross-sectional drawing and a top plan view of the layout for a circuit according to FIG. 4C, employing a pMOS and an nMOS tunneling capacitor, for tunneling electrons onto and off of the floating gate, respectively, and a four-terminal readout pFET to form a PNVFG device in accordance with another embodiment of the present invention.
Figure 13C:
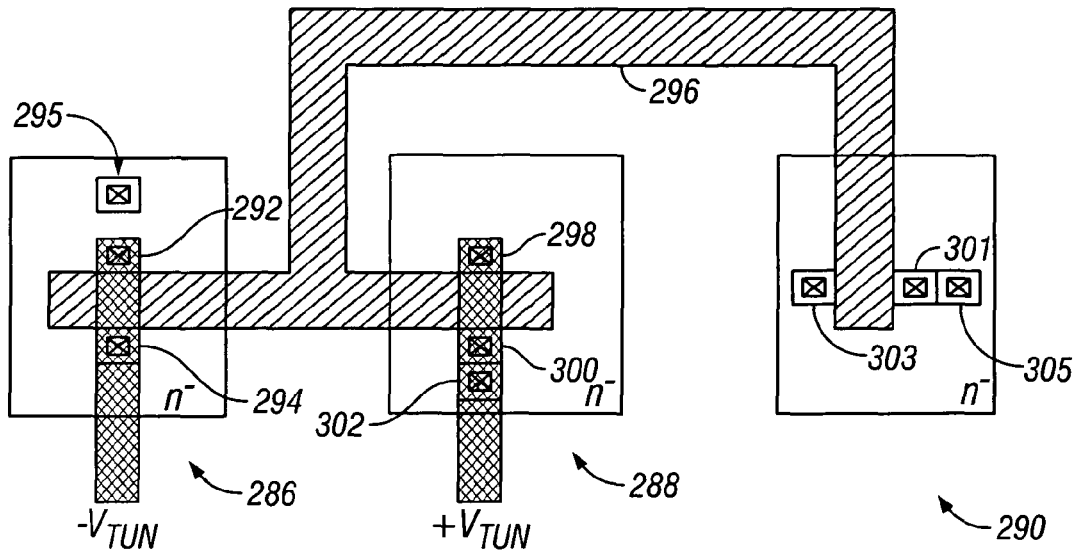
Figure 13B:
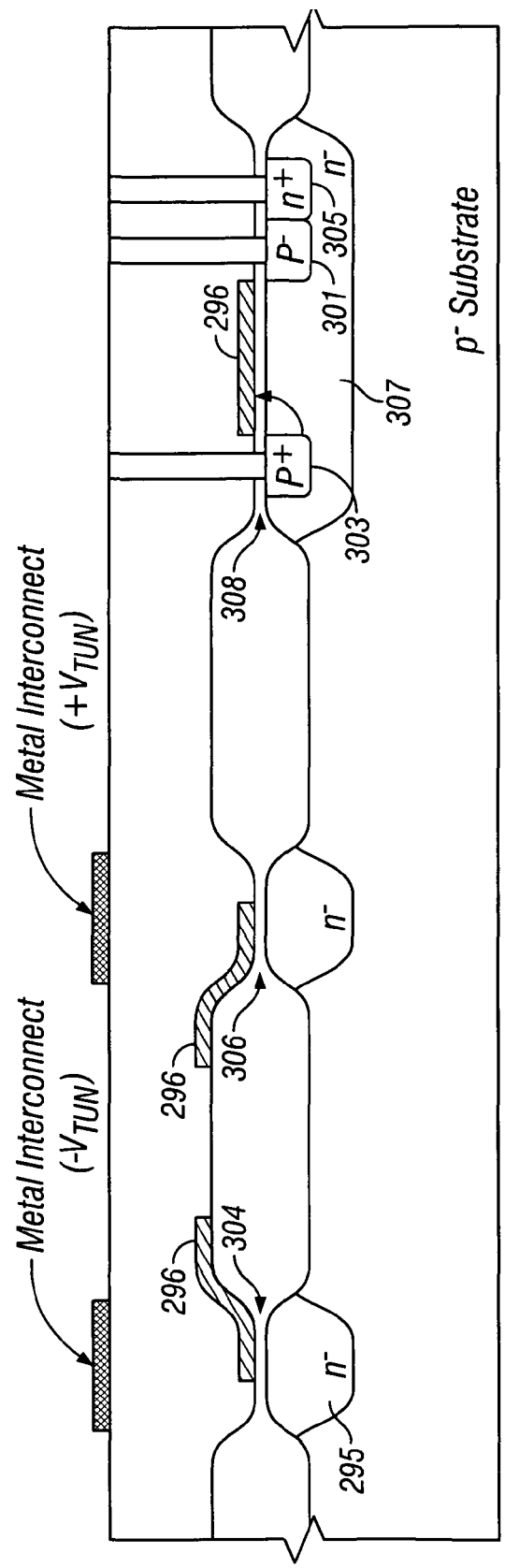

FIGS. 13A, 13B, and 13C are, respectively, an electrical schematic diagram, a side elevational cross-sectional drawing, and a top plan view of the layout for a circuit that implements the basic architecture of FIG. 4C, employing a pFET tunneling capacitor 286, an nFET tunneling capacitor 288, and a four-terminal readout pFET 290 to form a PNVFG charge-storage device in accordance with another embodiment of the present invention. The pFET tunneling capacitor 286 has its source 292 and drain 294 shorted together to comprise one plate of a tunneling capacitor; the floating gate or floating node 296 comprises the other plate. Its n– well 295 is brought out separately, and is not shorted to the common node shared by the source 292 and the drain 294. The nFET tunneling capacitor 288 has its source 298, drain 300, and well 302 shorted together to comprise one plate of a tunneling capacitor; the floating gate 296 comprises the other plate. Both tunneling capacitors use gate insulators 304, 306 sufficiently thin to allow direct electron tunneling. A four-terminal readout pFET 290 like that illustrated in FIGS. 12A, 12B, and 12C is provided, but performs no tunneling function in this embodiment because its gate insulator 308 is made sufficiently thicker than the insulator 304, 306 used in the tunneling capacitors that negligible tunneling or leakage occurs in or through it. Electrons are added to the floating gate 296 by applying a tunneling voltage that is lower than the floating-gate voltage to the shorted source 292 and drain 294 terminals of the pFET tunneling capacitor 286, causing electrons to tunnel through the gate insulator 304 to the floating gate 296. The n-well 295 may be biased the same as the shorted drain 294 and source 292 terminals, or it may be held at a potential at or above ground. Holding the well 295 at a fixed potential rather than shorting it to the drain 294 and source 292 terminals permits the pFET tunneling capacitor's drain 294 and source 292 terminals to be biased below ground, without turning on the p-substrate-to-n-well parasitic pn-junction diode. Electrons are removed from the floating gate 296 by applying a tunneling voltage that is higher than the floating-gate voltage to the shorted source 298, drain 300, and n-well 302 of the nFET tunneling capacitor 288, causing electrons to tunnel through the gate insulator 306 off the floating gate 296. Readout pFET 290 has a source 301, drain 303 and well contact 305 and is disposed in n– well 307.

Figure 14A:
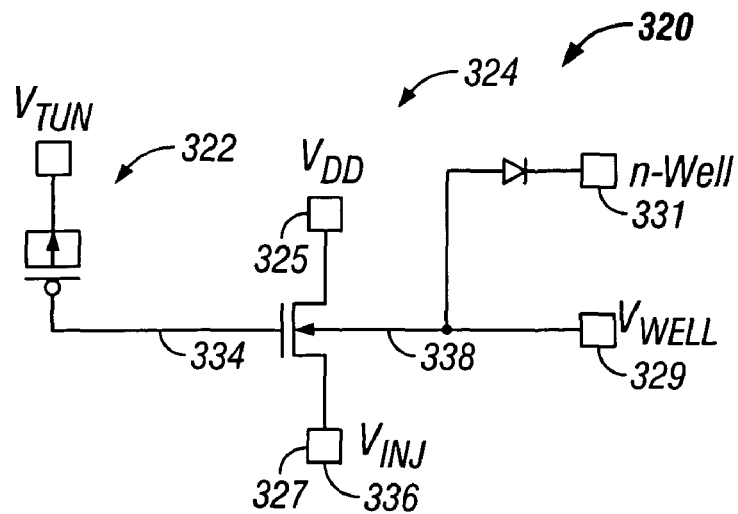
FIGS. 14A, 14B, and 14C are, respectively, an electrical schematic diagram, a side elevational cross-sectional drawing, and a top plan view of the layout for a circuit according to FIG. 7C, employing a single pMOS tunneling capacitor with a four-terminal readout nFET to form a PNVFG device in accordance with one embodiment of the present invention.
Figure 14C:
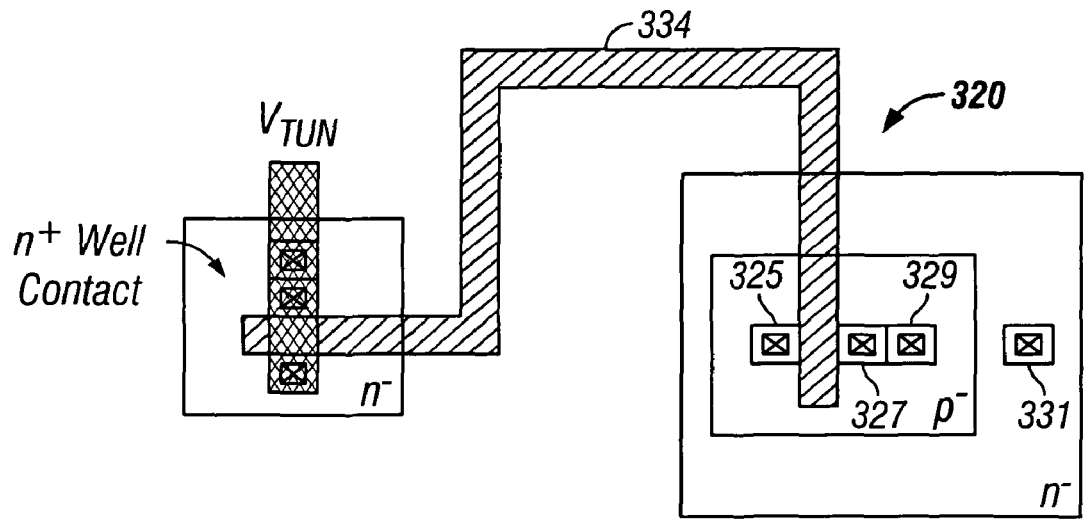
Figure 14B:
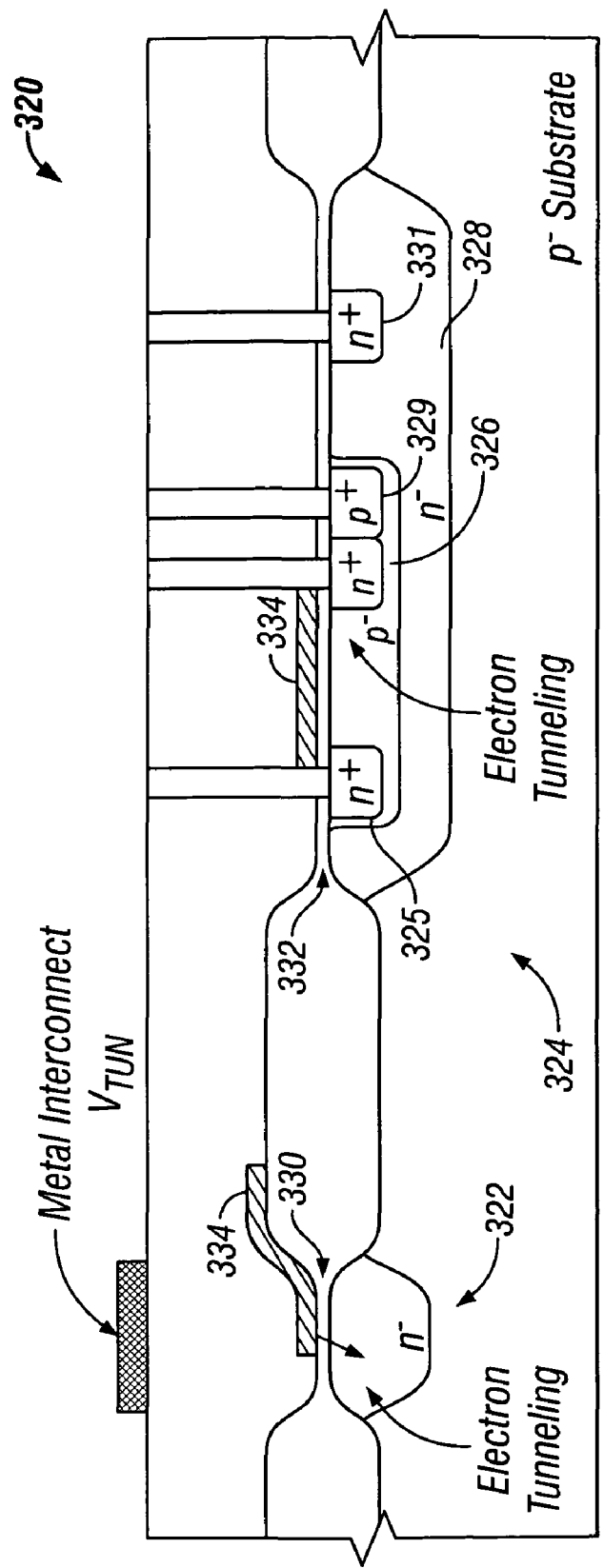

FIGS. 14A, 14B, and 14C are, respectively, an electrical schematic diagram, a side elevational cross-sectional drawing, and a top plan view of the layout for a circuit 320 that implements the circuit of FIG. 7C, comprising a pFET tunneling capacitor 322 and a four-terminal readout nFET 324 to form a PNVFG charge-storage device in accordance with one embodiment of the present invention. The readout nFET 324 is fabricated in an isolated p– well 326 within an n– well 328, and so this circuit must be produced in a CMOS process that allows isolated p– wells. Both transistors use gate insulators 330, 332 sufficiently thin to allow direct electron tunneling. Electrons are added to the floating gate 334 by pulling the readout nFET's source 336 and/or p– well 338 voltage far enough below the floating-gate voltage that electrons tunnel to the floating gate 334. Electrons are removed from the floating gate 334 by raising the pFET tunneling capacitor's shorted n-well, source, and drain voltage far enough above the floating-gate voltage that electrons tunnel off the floating gate 334. Readout transistor 324 has an n+ drain contact 325 to which $V_{DD}$ is applied, an n+ source contact 327 to which $V_{INJ}$ is applied, a p+ isolated p– well contact 329 to which $V_{WELL}$ is applied and an n+ deep n– well contact 331 to which $V_{DD}$ or ground is applied.

Figure 15A:
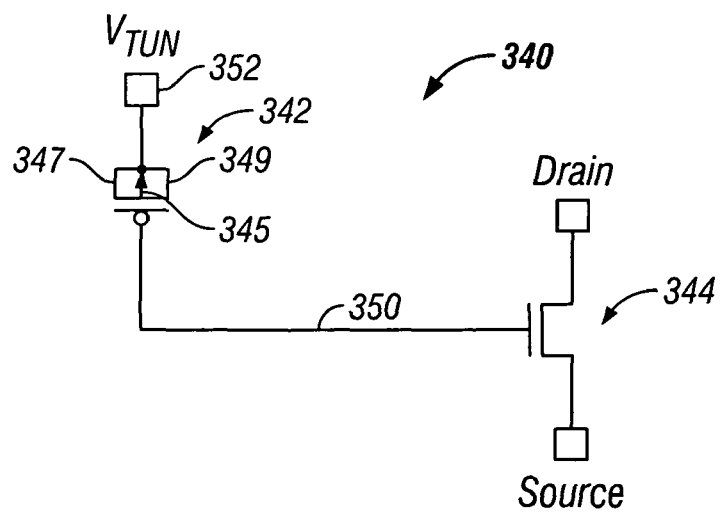
FIGS. 15A, 15B, and 15C are, respectively, an electrical schematic diagram, a side elevational cross-sectional drawing, and a top plan view of the layout for a circuit that uses a single pMOS tunneling capacitor to remove electrons from the floating gate, and a four-terminal readout nFET that adds electrons to the floating gate via channel hot-electron injection (CHEI), to form a PNVFG device in accordance with one embodiment of the present invention.
Figure 15C:
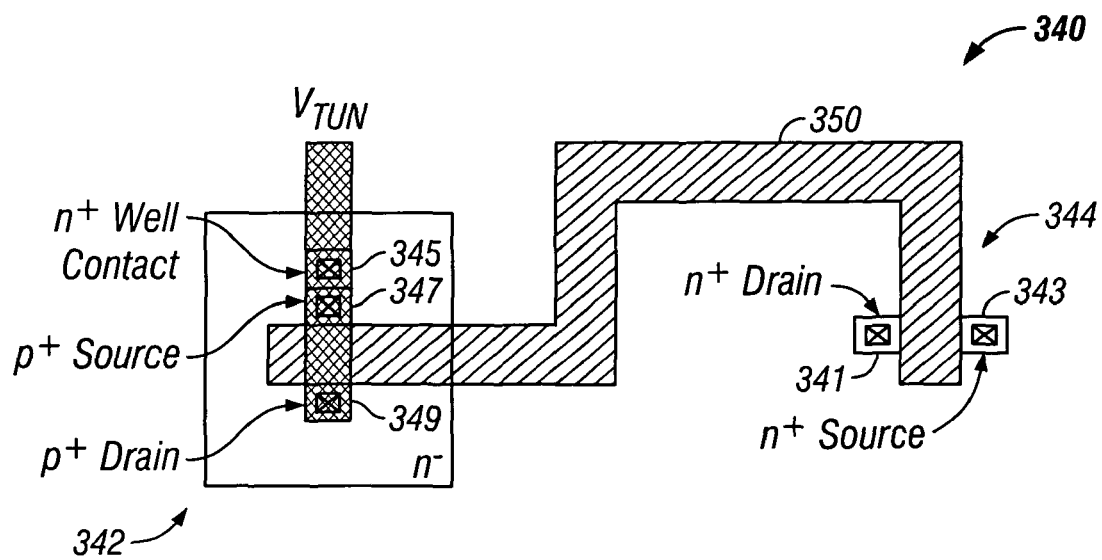
Figure 15B:
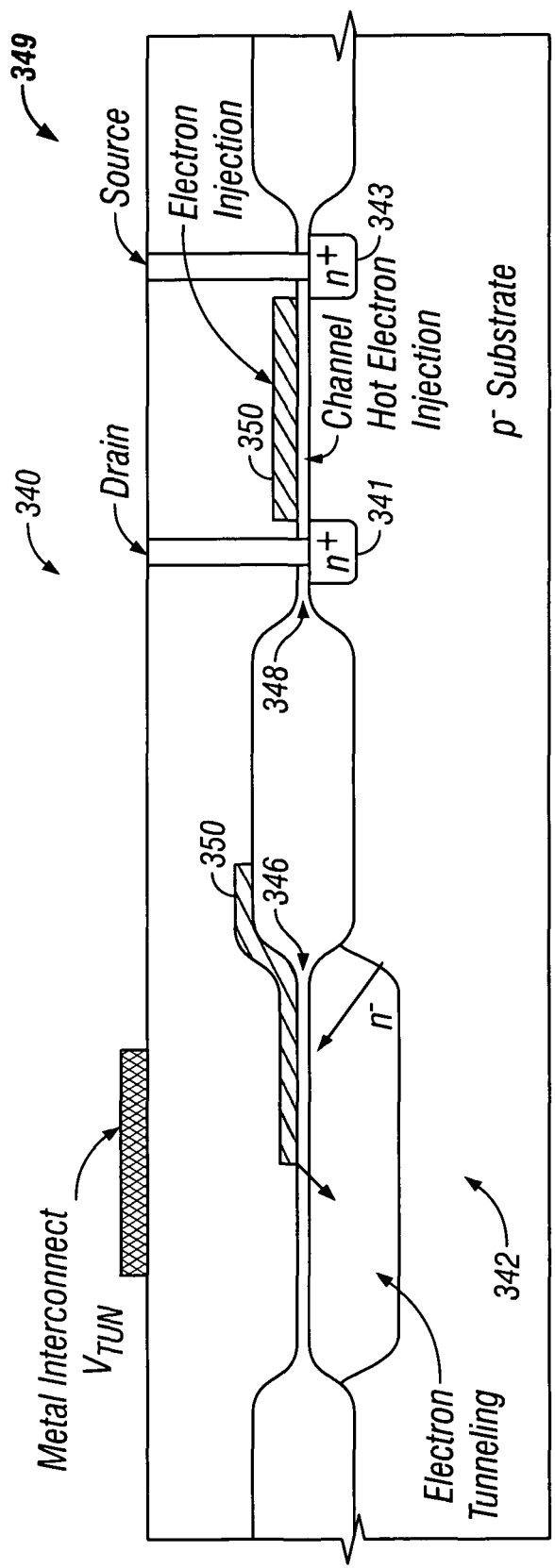

FIGS. 15A, 15B, and 15C are, respectively, an electrical schematic diagram, a side elevational cross-sectional drawing, and a top plan view of the layout for a circuit 340 comprising a pFET tunneling capacitor 342 and a four-terminal readout-and-injection nFET 344 to form a PNVFG charge-storage device in accordance with one embodiment of the present invention. The pFET tunneling capacitor 342 uses a gate insulator 346 sufficiently thin to allow direct electron tunneling. The readout and injection nFET 344 uses a gate insulator 348 made sufficiently thick that it can accommodate the voltages required for channel-hot-electron injection (CHEI) without incurring insulator damage. When compared with the circuit of FIG. 14, the circuit of FIG. 15 has the readout nFET fabricated in substrate rather than in an isolated p-well, and uses CHEI rather than direct tunneling to add electrons to the floating gate 350. Electrons are added to the floating gate 350 by pulling the readout nFET's drain voltage far enough above its source voltage such that some of its channel electrons, accelerated in the nFET's drain-to-channel depletion region, collide with the semiconductor lattice, scatter upward into the gate insulator, overcome the difference in electron affinities between the semiconductor and the insulator and so enter the insulator's conduction band, and are collected by the floating gate 350. Electrons are removed from the floating gate 350 by raising the pFET tunneling capacitor's shorted n-well, source, and drain voltage (at node 352) far enough above the floating-gate voltage that electrons tunnel off the floating gate 350. Many other layout implementations are possible, but are not shown in order to avoid over-complicating the disclosure, such as fabricating the nFET in an isolated p-well; using source-side hot-electron injection to add electrons to the floating gate; or others as will now be apparent to those of ordinary skill in the art.

Figure 16A:
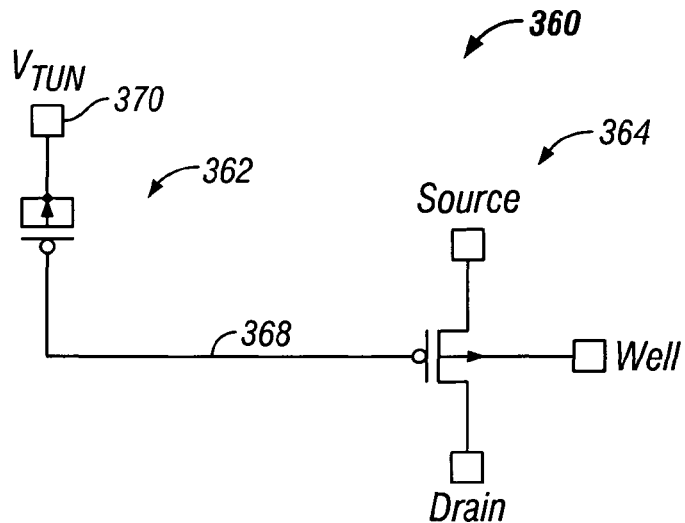
FIGS. 16A, 16B, and 16C are, respectively, an electrical schematic diagram, a side elevational cross-sectional drawing, and a top plan view of the layout for a circuit that uses a single pMOS tunneling capacitor to remove electrons from the floating gate, and a four-terminal readout pFET that adds electrons to the floating gate via impact-ionized hot-electron injection (IHEI), to form a PNVFG device in accordance with one embodiment of the present invention.
Figure 16C:
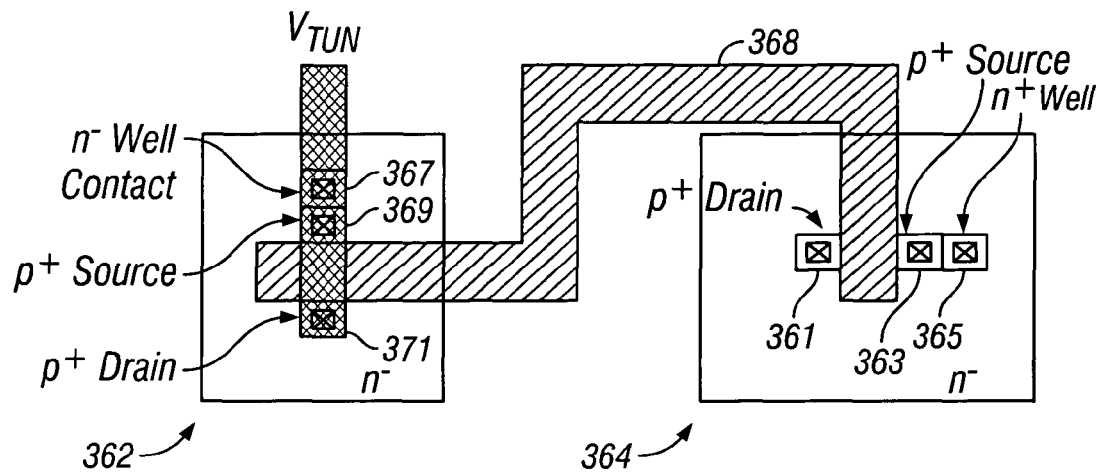
Figure 16B:
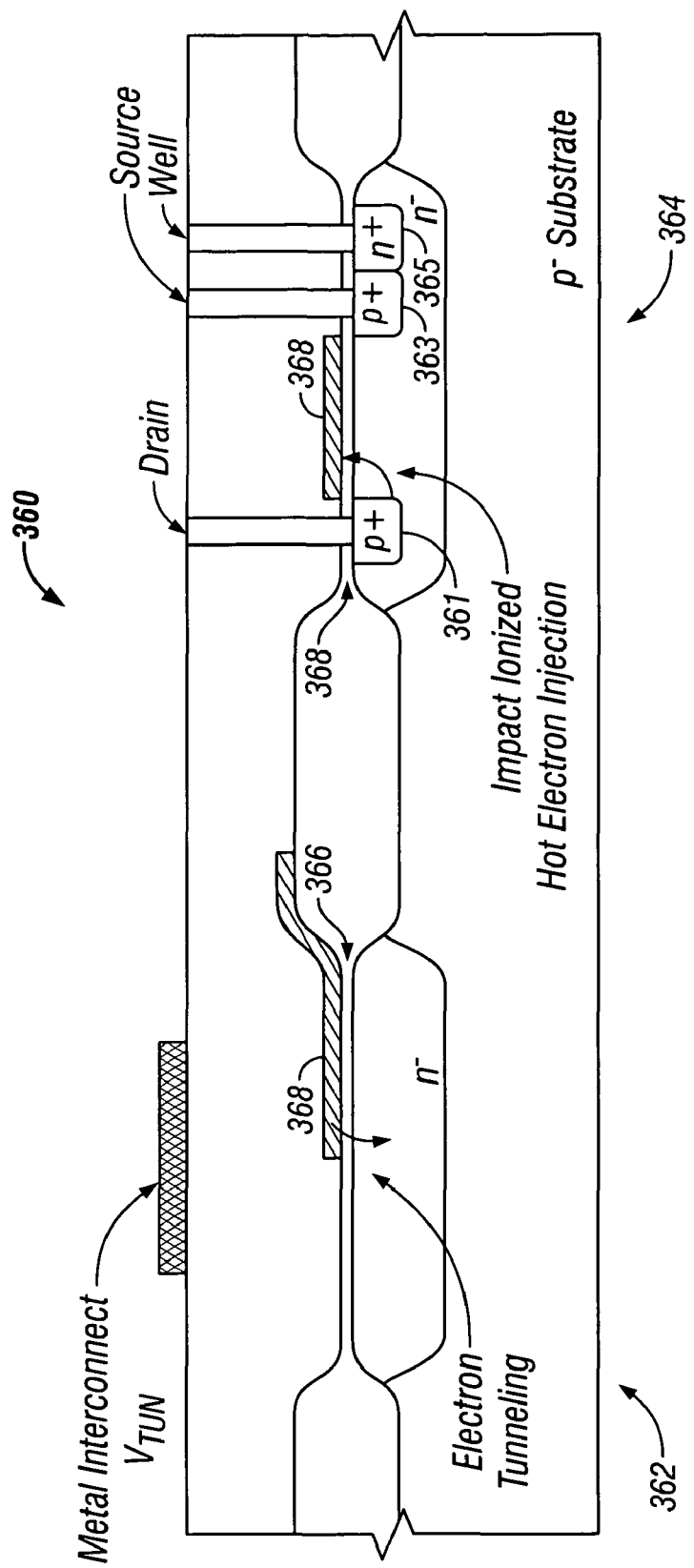

FIGS. 16A, 16B, and 16C are, respectively, an electrical schematic diagram, a side elevational cross-sectional drawing, and a top plan view of the layout for a circuit 360 comprising a pFET tunneling capacitor 362 and a four-terminal readout-and-injection pFET 364 to form a PNVFG charge-storage device in accordance with one embodiment of the present invention. The pFET tunneling capacitor 362 uses a gate insulator 366 sufficiently thin to allow direct electron tunneling. The readout and injection pFET 364 uses a gate insulator 368 made sufficiently thick that it can accommodate the voltages required for impact-ionized-hot-electron injection (IHEI) without incurring insulator damage. When compared with the circuit of FIG. 15, the circuit of FIG. 16 uses a readout-and-injection pFET 364 rather than a readout-and-injection nFET 344, and uses IHEI rather than CHEI to add electrons to the floating gate 368. Electrons are added to the floating gate 368 by Pulling the readout pFET's drain voltage far enough below its source voltage such that some of its channel holes, accelerated in the pFET's channel-to-drain depletion region, collide with the semiconductor lattice and generate free electrons by means of impact ionization. These free electrons are accelerated away from the drain region by the same channel-to-drain electric field, and some of them scatter upward into the gate insulator, overcome the difference in electron affinities between the semiconductor and the insulator and so enter the insulator's conduction band, and are collected by the floating gate 368. Pulling the readout pFET's drain voltage far enough below its source voltage can also generate electrons by means of band-to-band tunneling in the pFET's drain-to-channel depletion region; this mechanism of generating electrons can occur in concert with, or instead of, impact ionization. Electrons are removed from the floating gate 368 by raising the pFET tunneling capacitor's shorted n-well, source, and drain voltage at node 370 far enough above the floating-gate voltage that electrons tunnel off the floating gate 368. Many other layout implementations are possible, but are not shown in order to avoid over-complicating the disclosure, such as using a single thin-oxide pFET for both direct tunneling and for IHEI, or others as will now be apparent to those of ordinary skill in the art.

Figure 17A:
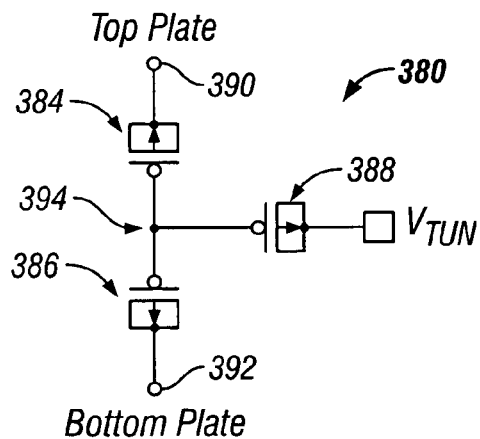
FIGS. 17A and 17B are, respectively, an electrical schematic diagrams of a PNVFG voltage-variable capacitor, and an electrical schematic diagram of a refresh circuit to update the capacitor's floating-gate charge, in accordance with one embodiment of the present invention.
Figure 17B:
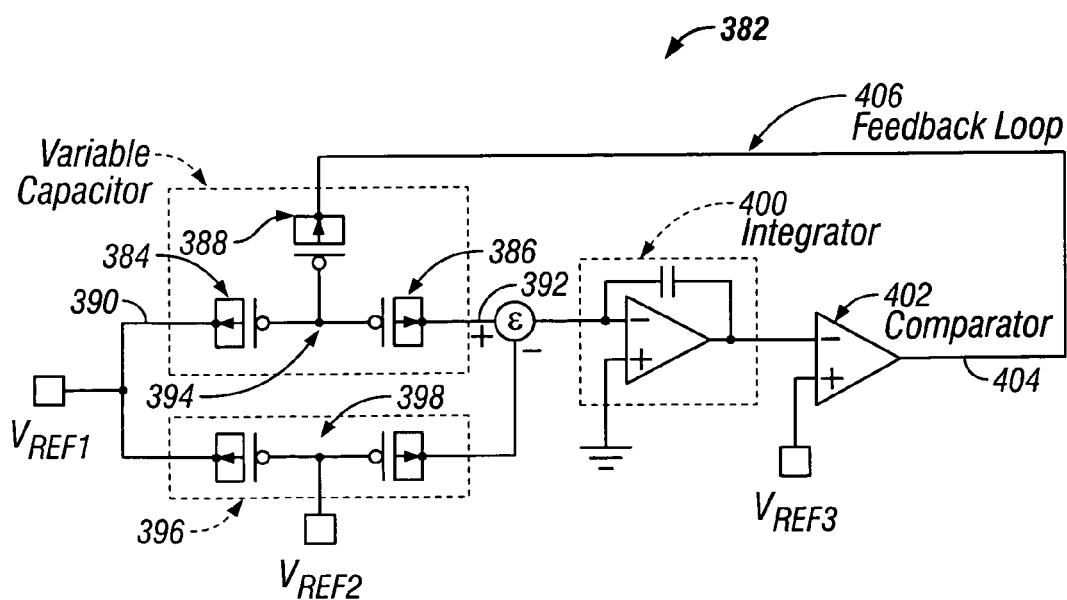

FIGS. 17A and 17B are, respectively, an electrical schematic diagram of a PNVFG voltage-variable capacitor 380, and an electrical schematic diagram of a charge-refresh circuit 382 which may be used to update the voltage-variable capacitor's floating-gate charge in, accordance with one embodiment of the present invention. The voltage-variable capacitor 380 in FIG. 17A comprises pFETs 384, 386, and 388. The pFETs 384, 386 have gate insulators made sufficiently thicker than the insulator used in pFET 388, such that negligible tunneling or leakage occurs in or through them. The pFET 388 is a tunneling capacitor having a gate oxide sufficiently thin that direct electron tunneling can occur as shown in FIG. 3. The capacitance measured from top plate 390 to bottom plate 392 of the voltage-variable capacitor may be varied by adjusting the quantity of charge stored on floating gate 394. To adjust and/or refresh this charge quantity, the charge refresh circuit 382 of FIG. 17B provides a means of applying tunneling pulses to pFET 388's shorted source, drain, and well. The refresh circuit acts to compare the voltage-variable capacitor with a reference capacitor 396, whose gate 398 is provided with a reference voltage $V_{REF2}$ (set equal to the desired floating gate voltage) to set its capacitance value. This comparison is performed as follows: Both the variable capacitor 380 and the reference capacitor 396 are first charged to a reference voltage, $V_{REF1}$. The amount of charge stored on the two capacitors 380, 396 is integrated by integrator 400 in a conventional manner and compared against a reference voltage $V_{REF3}$ at comparator 402. If the two charge quantities are not equal, a tunneling pulse of proper polarity at the output 404 of comparator 402 will be applied to the shorted source, drain, and well of tunneling capacitor 388. During refreshing, feedback loop 406 applies these tunneling pulses of polarity $+V_{tun}$ or $-V_{tun}$ to adjust the quantity of electronic charge stored on floating gate 394, so that the value of the variable capacitor is set equal to the reference capacitor 396. As will now be apparent to those of ordinary skill in the art, similar techniques may be used to refresh the charge on a floating gate in circuits such as variable resistors, variable current sources, variable voltage sources, variable time delays, analog- and/or digital-valued memories, and others.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A programming device for supporting a readout device that is adapted to store a variable amount of charge in a floating gate, comprising:
    a substrate including a first doped region that is doped with impurities of a first conductivity;
    a plurality of contacts of the first conductivity type in contact with the first doped region;
    a plurality of contacts of a second conductivity type in contact with the first doped region;
    a first insulating layer on the substrate; and
    a floating gate disposed on the insulating layer, a first segment of the floating gate located proximately to the contacts of the first conductivity type relative to the contacts of the second conductivity type, and a second segment of the floating gate located proximately to the contacts of the second conductivity type relative to the contacts of the first conductivity type, wherein the first insulating layer placed underneath the floating gate is of a thickness to cause direct tunneling of charge between the substrate and the floating gate responsive to applying a voltage difference between the substrate and the floating gate; and
    a biasing circuitry configured to move charge bidirectionally between the floating gate and the substrate via direct tunneling.

2. The device of claim 1, wherein the readout device is a FET.

3. The device of claim 1, wherein the first conductivity is n-type.

4. The device of claim 1, wherein the first conductivity is p-type.

5. The device of claim 1, wherein the substrate further comprises:
    a second doped region doped with impurities of the first conductivity.

6. The device of claim 5, wherein the first doped region is shorted together with the second doped region.

7. The device of claim 1, wherein the substrate further comprises:
    a second doped region doped with impurities of a second conductivity, and wherein the first doped region is shorted together with the second doped region.

8. The device of claim 1, wherein the floating gate is shared with a second readout device.

9. The device of claim 1, wherein the biasing circuitry is adapted to operate while programming voltages are applied to terminals of the readout device.

10. The device of claim 1, further comprising:
    an interconnect connecting a first contact of the contacts of the first conductivity type with a first contact of the contacts of the second conductivity type.

11. The device of claim 1, further comprising:
    a shorting element connecting a second contact of the contacts of the first conductivity type with a second contact of the contacts of the second conductivity type.

12. The device of claim 11, wherein the shorting element comprises silicide.

13. The device of claim 1, wherein the first insulating layer is between 10 and 50 angstroms thick underneath the floating gate.

* * * * *